United States Patent
Borland et al.

(10) Patent No.: US 7,841,075 B2
(45) Date of Patent: Nov. 30, 2010

(54) METHODS FOR INTEGRATION OF THIN-FILM CAPACITORS INTO THE BUILD-UP LAYERS OF A PWB

(75) Inventors: William Borland, Chapel Hill, NC (US); Daniel I. Amey, Jr., Durham, NC (US); Karl H. Dietz, Raleigh, NC (US); Cengiz Ahmet Palanduz, Durham, NC (US); J. Stan Erickson, Cary, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 811 days.

(21) Appl. No.: 11/765,113

(22) Filed: Jun. 19, 2007

(65) Prior Publication Data

US 2008/0316723 A1    Dec. 25, 2008

(51) Int. Cl.
*H05K 3/20*    (2006.01)

(52) U.S. Cl. .................. 29/831; 29/25.42; 174/260; 361/763; 438/239

(58) Field of Classification Search ............. 29/25.41, 29/25.42, 592.1, 831, 832, 846, 852; 174/255, 174/260; 257/328; 361/763, 766; 438/239, 438/250, 652

See application file for complete search history.

(56) References Cited

U.S. PATENT DOCUMENTS

| | | | |
|---|---|---|---|
| 5,161,086 A | 11/1992 | Howard et al. | |
| 5,428,499 A * | 6/1995 | Szerlip et al. | 361/328 |
| 6,388,207 B1 | 5/2002 | Figueroa et al. | |
| 6,577,490 B2 * | 6/2003 | Ogawa et al. | 174/260 |
| 6,611,419 B1 | 8/2003 | Chakravorty | |
| 6,818,469 B2 * | 11/2004 | Mori et al. | 438/250 |
| 2005/0141171 A1 | 6/2005 | Borland | |
| 2005/0204864 A1 | 9/2005 | Borland et al. | |
| 2006/0138591 A1 | 6/2006 | Amey et al. | |
| 2006/0158828 A1 | 7/2006 | Amey, Jr. et al. | |
| 2007/0090511 A1 | 4/2007 | Borland et al. | |

FOREIGN PATENT DOCUMENTS

| | | |
|---|---|---|
| EP | 1551041 A | 7/2005 |
| EP | 1675449 A | 6/2006 |
| EP | 1777745 A | 4/2007 |

OTHER PUBLICATIONS

Hirata, Y., Nakano, H., & Shimada, Y. (Feb. 21, 2007) "Development of Novel Thin Material for Decoupling Capacitors Embedded in PWBs", Proceedings of the Technical Conference, IPC Printed Circuits Expo, Session 22, Los Angeles.
International Search Report dated Dec. 4, 2008, International Application No. PCT/US2008/067177.

* cited by examiner

Primary Examiner—Donghai D. Nguyen

(57) ABSTRACT

Provided herein are devices comprising a printed wiring board that comprise, singulated capacitors fabricated from known good, thin-film, fired-on-foil capacitors. Provided are methods of incorporating the singulated capacitors into the build-up layers of a printed wiring board to minimize impedance. The singulated capacitors have a pitch that allows each power and ground terminal of an IC to be directly connected to a power and ground electrode, respectively, of its own singulated capacitor. Using a feedstock of known good, fired-on-foil capacitors allows for improved PWB yield.

14 Claims, 20 Drawing Sheets

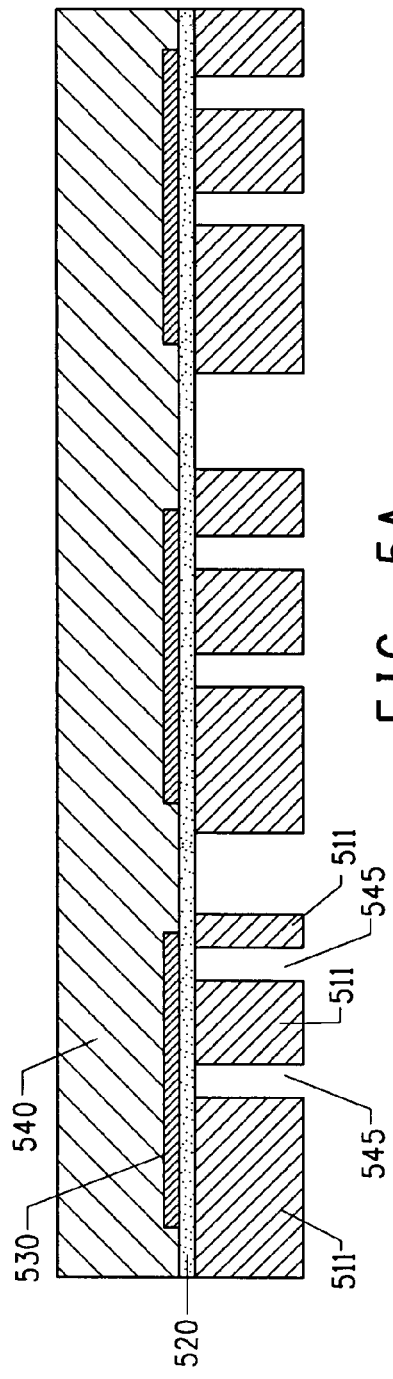
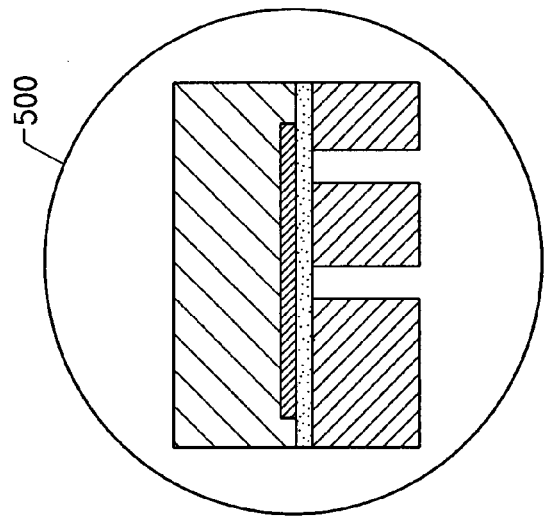
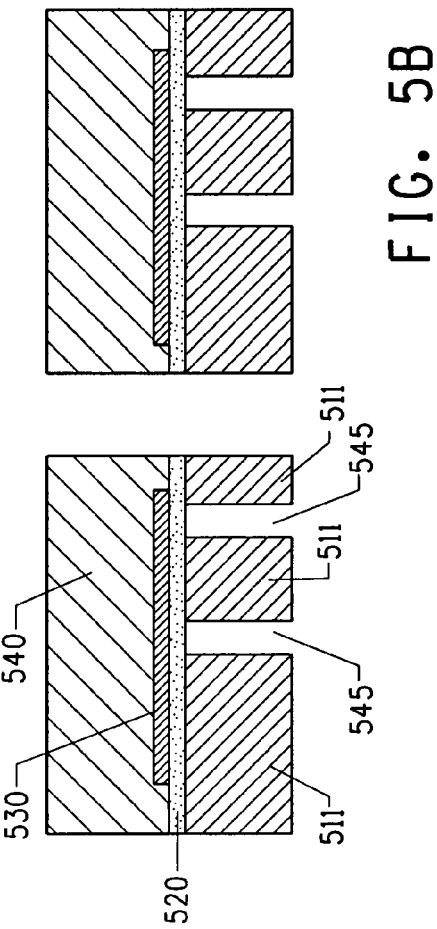
FIG. 5A
FIG. 5B

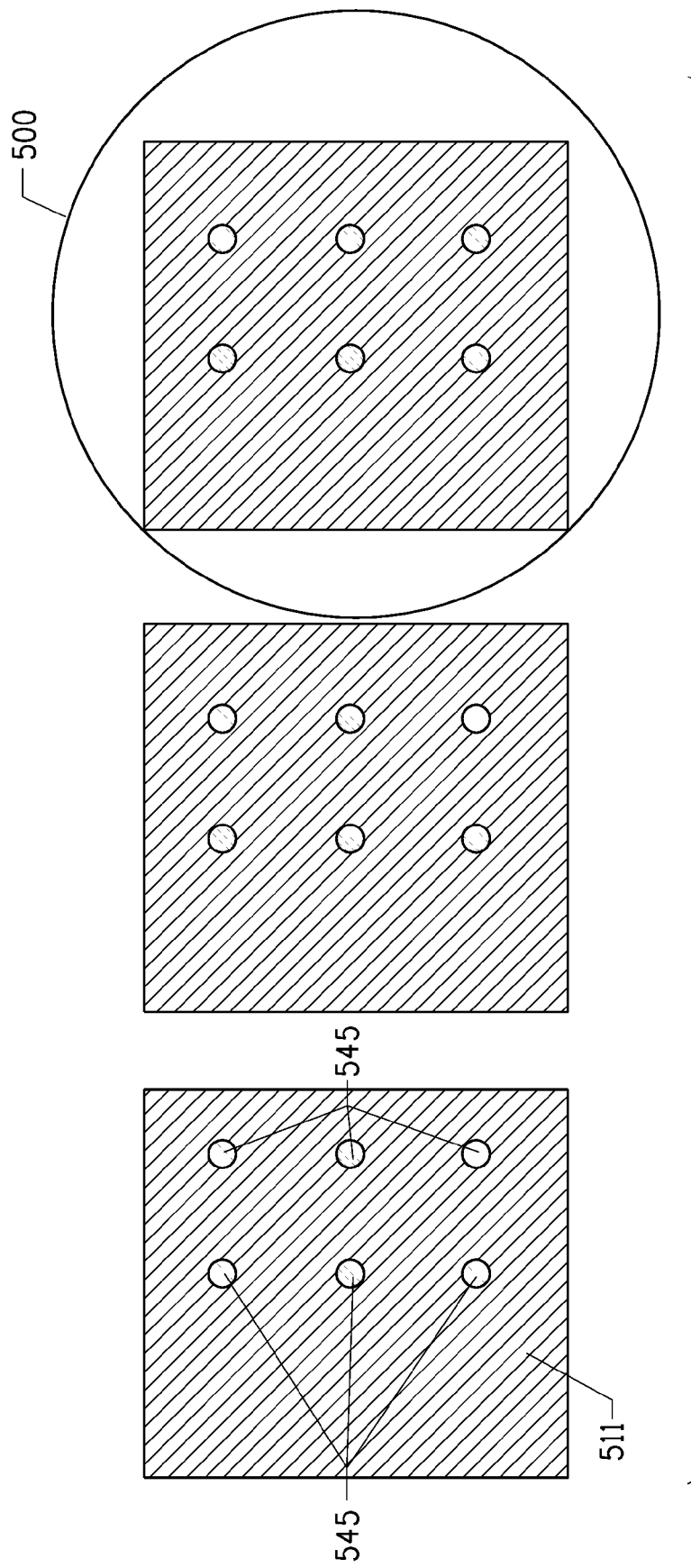

METHODS FOR INTEGRATION OF THIN-FILM CAPACITORS INTO THE BUILD-UP LAYERS OF A PWB

FIELD OF THE INVENTION

The technical field relates to methods of incorporating devices that have high capacitance into the build-up layers of printed wiring boards to provide low inductance power to the semiconductor device.

BACKGROUND OF THE INVENTION

Semiconductor devices including integrated circuits (IC) operate at increasingly higher frequencies and data rates and at lower voltages. Higher operating frequencies, that is, higher IC switching speeds, mean that voltage response times to the IC must be faster. Lower operating voltages require that allowable voltage variations (ripple) and noise become smaller.

For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin; the IC will malfunction. Additionally, as the IC powers up, a slow response time will result in power overshoot.

Consequently, the production of noise in the power and ground (return) lines and the need to supply sufficient current to accommodate faster circuit switching pose an increasingly important problem in semiconductor devices.

Controlling power droop and overshoot within allowable limits, thereby stabilizing power delivery to the IC, is achieved by the use of capacitors placed close enough to the IC to provide or absorb power within the appropriate response time. Lowering noise in the power distribution system is accomplished by lowering impedance.

In conventional circuits, impedance is reduced by the use of additional surface mount capacitors interconnected in parallel and clustered around the IC. Large value capacitors are placed near the power supply, mid-range value capacitors at locations between the IC and the power supply, and small value capacitors very near the IC. This distribution of capacitors is designed to reduce voltage response time as power moves from the power supply to the IC. As frequencies increase and operating voltages continue to drop, increased power must be supplied at faster rates, which requires increasingly lower inductance and impedance levels.

FIG. 1 is an electrical schematic of placement of capacitors with respect to an IC device and the power supply. Shown is a power supply, an IC device and the capacitors 4, 6 and 8, which represent high value, mid-range value and small value capacitors, respectively, used for impedance reduction and minimizing power droop and dampening overshoot as described above.

FIG. 2 is a representative section view in front elevation of a PWB according to the electrical schematic represented by FIG. 1 and shows prior art connections of Surface Mount Technology (SMT) capacitors 50 and 60 (capacitors identified as 8 in FIG. 1) and IC device 40 to the power and ground planes in the substrate of the PWB. IC device 40 is connected to lands 41 by solder filets 44. Lands 41 are connected to plated through hole via pads of vias 90 and 100 by circuit lines 72 and 73. Via pads are shown generically as 82. Via 90 is electrically connected to conductor plane 120 and via 100 is connected to conductor plane 122. Conductor planes 120 and 122 are connected to the power or voltage side of the power supply and to the ground or return side of the power supply. Small value capacitors 50 and 60 are similarly electrically connected to vias and conductor planes 120 and 122 in such a way that they are electrically connected to IC device 40 in parallel. In the case of IC devices placed on modules, interposers, or packages, the large and medium value capacitors may reside on the printed wiring mother board to which the modules, interposers, or packages are attached.

Interconnecting a large number of capacitors in parallel, which is the conventional practice shown in FIG. 1 as conventionally practiced, reduces power system impedance but also requires complex electrical routing. This has the unfavorable consequence of increasing circuit loop inductance, which in turn increases impedance, constrains current flow and in part reduces the benefit of using surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard et al. discloses a capacitive printed circuit board having a capacitor laminate (planar capacitor) placed within multiple layers of the board, onto which has been placed a large number of devices, such as integrated circuits. These devices are operatively coupled with the capacitor laminate(s). Howard et al. provides increased capacitive function by employing borrowed or shared capacitance. However, this approach to capacitor placement does not provide high capacitance and does not necessarily improve voltage response. Simply placing the capacitor laminate closer to the IC is not a satisfactory technical solution to provide high capacitance as the total available capacitance may be insufficient to adequately minimize impedance.

U.S. Pat. No. 6,611,419 to Chakravorty discloses that power supply terminals of an integrated circuit die can be coupled to the respective terminals of at least one embedded capacitor in a multilayer ceramic substrate.

U.S. Pat. App. Pub. No. 2006-0138591 to Amey et al. discloses methods for incorporating high capacitance capacitors into the core of a printing wiring board and merely suggests that these may be placed in the build-up layers. However, Amey et al. does not disclose or suggest methods for placing tested and known good capacitors into the build-up layers. Moreover, the Amey et al. methods of forming capacitors do not teach or contemplate testing of capacitors at the foil level since the Amey et al. capacitors are shorted at the foil level. In addition, Amey et al. does not disclose how it is possible to affect yield of the final PWB product by either discarding entire foils with poor capacitor yield or individual capacitors that have tested bad.

Hirata et al. in "Development of Novel Thin Material for Decoupling Capacitors Embedded in PWBs", Proceedings of the Technical Conference, IPC Printed Circuits Expo, Los Angeles, 2007 disclose forming a metal/insulator/metal (MIM) laminate structure, patterning and etching the top metal layer to form electrodes and cutting the structure into individual, singulated capacitors, 1 mm$^2$ to 100 mm$^2$ in size. These capacitors can be tested and the known good capacitors attached to the printed wiring board using adhesive. The capacitor size and design are not suited to deliver power to an IC, such as a microprocessor, having many power and ground terminals. Hirata et al. cannot suggest the technical solution described herein.

Thus, a current problem is to develop methods of incorporating, that is, placing a plurality of capacitors into the build-up layers of a PWB, each capacitor being "known good" and having a size and a pitch whereby: each placed capacitor lies directly under and within the dimensions of the IC; and each power and ground terminal of the IC, such as a microprocessor, can be directly connected to the power and ground electrode, respectively, of a unique, placed capacitor.

The methods described herein solve this problem by using only known good capacitors to form a plurality of placed capacitors having very small sizes and of a fine pitch that allows all capacitors to lie directly under and within the dimensions of the IC. No combination of Howard et al., Chakravorty, Amey et al. and Hirata et al. or of other references suggests the present solution or constitutes a predictable result. Creating capacitors having these three features—of "known good" quality and of a size and a pitch—allows the incorporation of as many known good, singulated capacitors directly under and within the dimensions of the IC as an IC has power and ground terminals. This has the effective result of providing power to the IC at low impedance and creating a qualifiedly reliable PWB product.

SUMMARY

The claimed invention is directed to a device comprising a printed wiring board which supports an integrated circuit that has an area and a plurality of power, ground and signal terminals, the printed wiring board comprising:

a plurality of known good, singulated capacitors, each of which has a power electrode and a ground electrode and is formed from a known good, fired-on-foil capacitor having a first and second electrode with the second electrode having a footprint. Each known good, singulated capacitor is (1) formed within the footprint of the second electrode of the known good, fired-on-foil capacitor and embedded into the build-up layers of the printed wiring board, and (2) of a size and of a pitch such that the plurality of singulated capacitors lies directly under and within the area of the IC. In the device, each active power and ground terminal of the IC is directly connected to a corresponding power and ground electrode, respectively, of a known good, singulated capacitor. In the device, each signal terminal of the IC is directly connected to a signal pad isolated from the singulated capacitors but formed at the same time from the known good, fired-on-foil capacitor.

Also provided are methods of making these devices, which comprise:

providing at least one foil structure, which has two sides and a known good, thin-film, fired-on-foil capacitor, which has a dielectric layer and a second electrode layer having a footprint;

sputtering and plating with metal the second side of the foil structure containing the second electrode;

patterning the side of the foil structure not containing the second electrode, thereby forming a plurality of first electrodes;

laminating the patterned side of the foil structure to a build-up layer of a printed wiring board;

patterning the side of the foil structure containing the second electrode of the fired-on-foil capacitor, thereby forming a plurality of second electrodes within the footprint of the second electrode layer.

In all of these methods, the forming of first and second electrodes forms a plurality of singulated capacitors of a certain size and pitch so that each electrode may be directly attached to an active terminal of an IC. Further, the of singulated capacitors is in close proximity to the integrated circuit.

Morever, in some methods, the entire area of the dielectric layer is supported.

In addition, in some methods, the foil structure may be diced to form known good components which comprise at least one fired-on-foil capacitor. These components may be positioned by pick and place techniques onto a build-up layer of a PWB and then laminated to it.

Further, in some of these methods a core structure is laminated to the PWB. Alternatively, in other methods, no core structure is employed. Rather, the method results in a coreless structure, wherein the etched side of the foil structure not containing the fired-on-foil capacitor is laminated to other PWB layers. This creates a coreless multilayer structure either in a single lamination step wherein multiple layers are laminated together in unison, or in multiple lamination steps wherein each layer is laminated individually.

BRIEF DESCRIPTION OF THE DRAWINGS

The detailed description will refer to the following drawings, wherein like numerals refer to like elements, and wherein:

FIG. 5A-5G illustrate an alternative method of incorporation of a plurality of thin-film fired-on-foil singulated capacitors that have been derived from a known good capacitor into the build-up layers of a printed wiring board.

DETAILED DESCRIPTION

Figure 1:
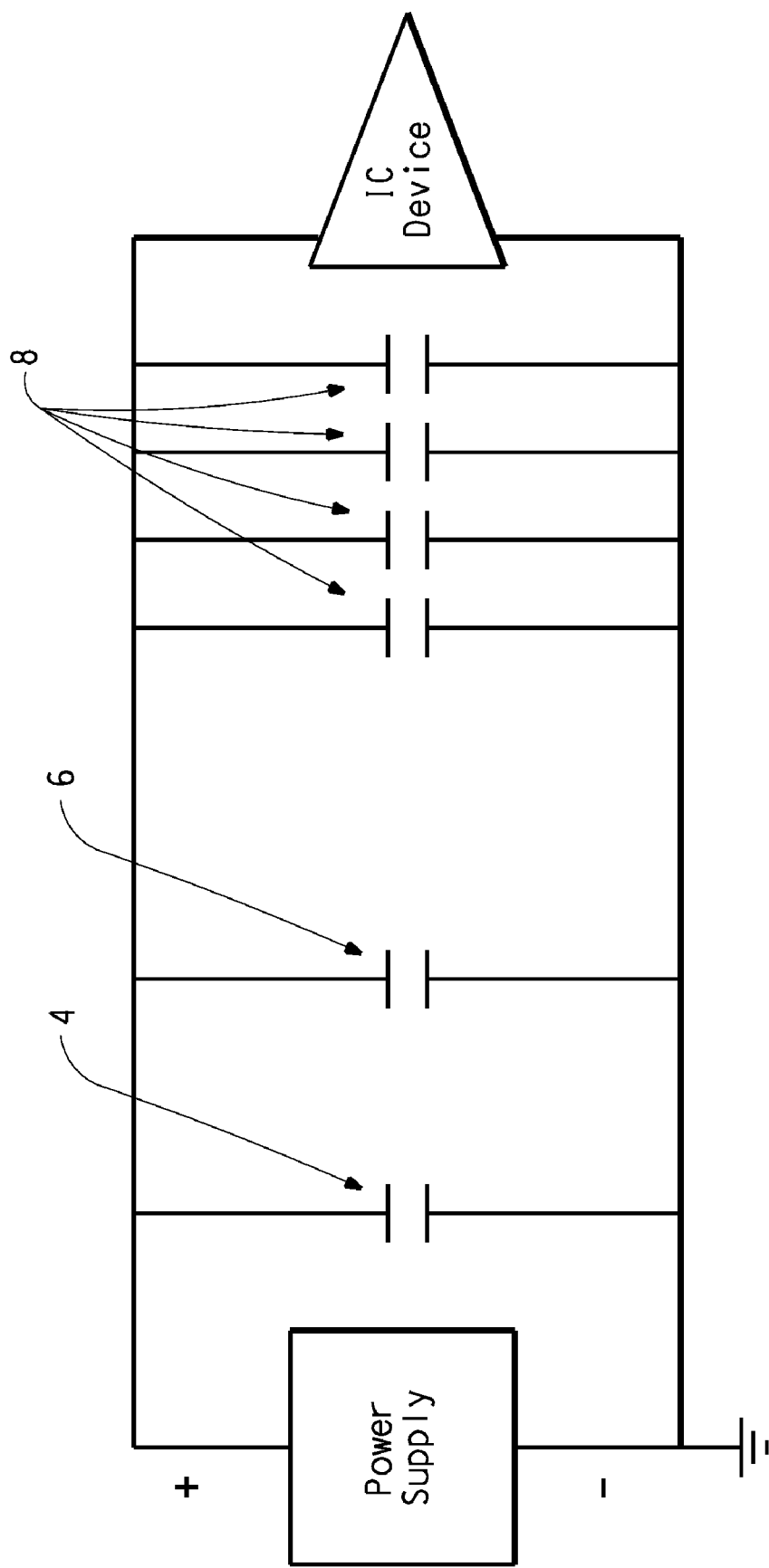
FIG. 1 depicts an electrical schematic of a typical placement of capacitors for impedance reduction and minimizing power droop or dampening overshoot.
Figure 2:
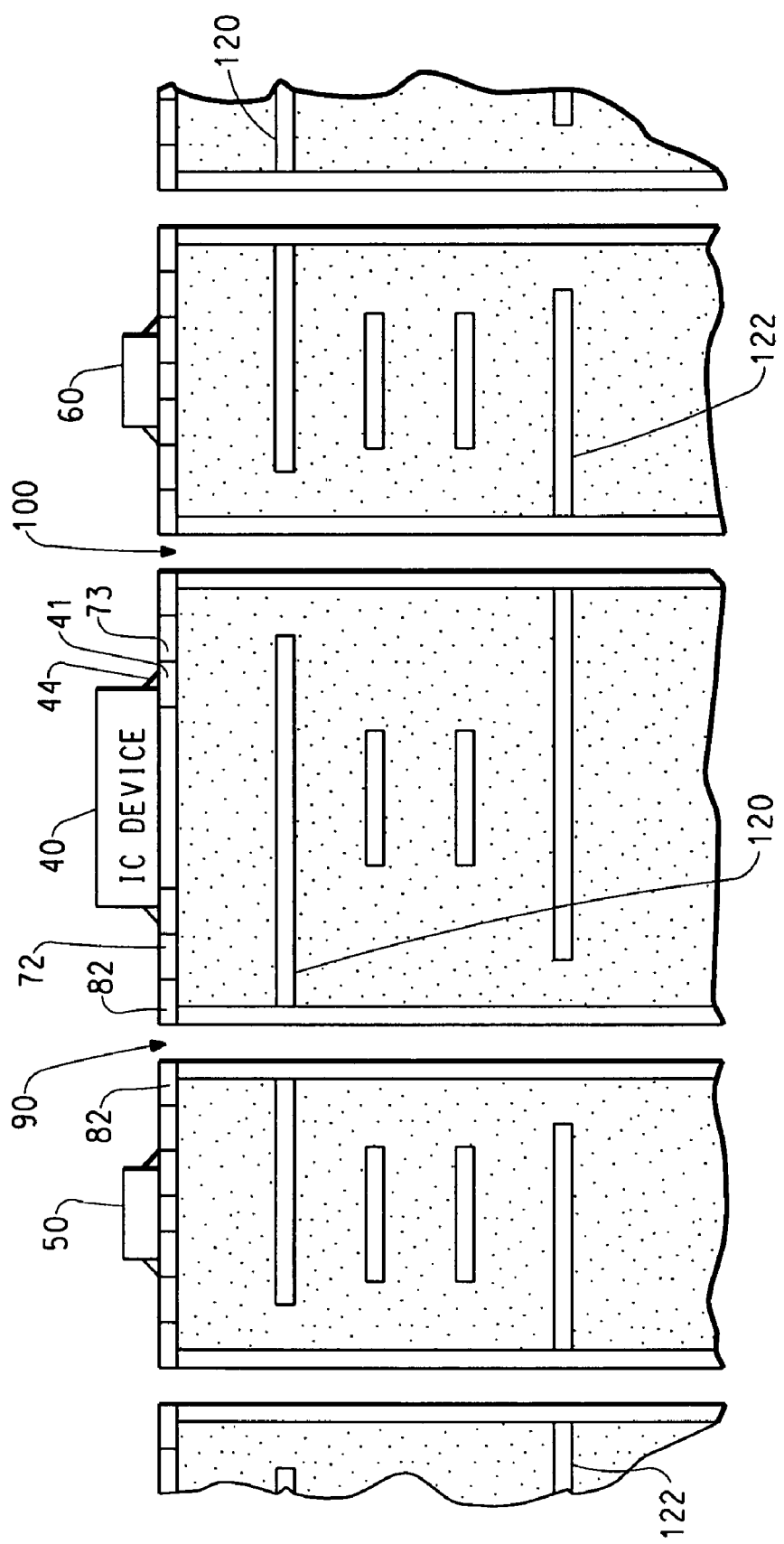
FIG. 2 depicts in section view in front elevation a prior art printed wiring board according to the electrical schematic of FIG. 1 having conventional surface mount technology capacitors used for impedance reduction and minimizing power droop or dampening overshoot.

The detailed description discusses the inventions recited in the claims with reference to the following defined terms:

As used herein, the term "incorporating" or "incorporation" refers to embedding capacitors into a printed wiring board and includes the concepts of placing, positioning and integrating the capacitors within the printed wiring board.

As used herein, the term "fired-on-foil thin-film capacitors" refers to capacitors that are formed by: (1) firing at an elevated temperature a dielectric layer deposited onto a metallic foil in order to crystallize and sinter the dielectric, which forms a high dielectric constant thin-film; and (2) depositing a top electrode before or after firing the dielectric.

As used herein, the terms "annealing" and "firing" are interchangeable and refers to an elevated temperature process.

As used herein, the term "high dielectric constant" or "high K, thin-film capacitor dielectric materials" refers to materials that have a bulk dielectric constant above 500 and can comprise perovskite-type ferroelectric compositions with the general formula $ABO_3$. Examples of such compositions include $BaTiO_3$; $BaSrTiO_3$; $PbTiO_3$; $CaTiO_3$; $PbZrO_3$; $BaZrO_3$ and $SrZrO_3$ or mixtures thereof. Other compositions are also possible by substitution of alternative elements into the A and/or B position, such as $Pb(Mg_{1/3}Nb_{2/3})O_3$ and $Pb(Zn_{1/3}Nb_{2/3})O_3$. Mixed metal versions of the above compositions are also suitable.

As used herein, the term "printed wiring board" or "printed wiring board device" [PWB] refers to an interposer, multichip module, area array package, semiconductor package, system-on-package, system-in-package, and the like, or a device used as such.

As used herein, the term "PWB core" or "PWB laminated core" refers to printed wiring board structure that is formed in one lamination step from a number of inner layer PWB panels. A PWB core is typically used as the base for additional metal/dielectric layers that are built up or sequentially added to the core.

As used herein, the term "build-up-" or "build-up layer" refers to those layers of a printed wiring board that are built up by additions of organic dielectric and patterned copper layers to one or both sides of a PWB laminated core.

As used herein, the term "printed wiring motherboard" or "PWB motherboard" refers to a large printed wiring board that the printed wiring board as defined above, is generally placed on and interconnected to.

As used herein, the term "foil" refers to a general metal layer, plated metal, sputtered metal or metal layer formed or deposited in any fashion known to one of skill in the art.

As used herein, the term "good-" or "known good capacitor" refers to a capacitor that has been tested and is known to be functioning within predetermined specifications.

As used herein, the term "known good capacitor electrode" refers to an electrode of a known good capacitor.

As used herein, the term "singulated capacitor" refers to one of the plurality of capacitors formed from dividing a single large, known good, fired-on-foil capacitor. The single large, fired-on foil-capacitor has been previously tested and determined as known good. Any singulated capacitor may or may not have one or both (top or bottom) electrodes common with other singulated capacitors made from the same, large fired-on-foil capacitor.

As used herein, a common electrode refers to a continuous capacitor electrode that functions as 2 or more electrodes for 2 or more singulated capacitors.

As used herein, the term "dicing" refers to cutting a foil structure containing multiple large, tested fired-on-foil capacitors into specific dimensions to form units that contain one or more large capacitors. Dicing is usually accomplished with a diamond saw and the foil is cut to be larger than the capacitor dielectric area of the one or more, large capacitor(s).

As used herein, "known good component" refers to a diced foil structure wherein each unit contains one or more large known good capacitor(s).

As used herein, the term "electrode footprint" refers to the position and area of a sputtered capacitor electrode.

As used herein, the term "good-" or a "known good printed wiring board or PWB" refers to a printed wiring board that has been tested and all embedded capacitors and circuitry are known to be functioning within predetermined specifications.

As used herein, the term "fine pitch" is a term of art and refers to capacitors having a separation of 25 mils or less.

As used herein, the term "pick-and-place" is a term of art and refers to an assembly process in which components are selected and placed onto specific locations according to the assembly file of the circuit.

As used herein, the term "common area of first and second electrodes" refers to that overlapping area in a capacitor that contains a portion of both the first and the second electrode and is used to calculate the capacitance from the formula:

$$C=0.885\, KA/t,$$

where
C is capacitance in nano Farads;
0.885 is a constant;
K is the dielectric constant;
t is the thickness of the dielectric layer in micrometers (microns);
and A is the common area of the first and second electrode in $cm^2$.

As used herein, the term "integrated circuit" (IC) refers to a semiconductor chip, for example, a microprocessor, a transistor set, logic device, etc.

As used herein, the term "directly connected" refers to interconnection of two features by vias rather than conductor traces that are in the horizontal plane.

As used herein, the term "close proximity" refers to the fact that capacitors are placed directly under and within the area, i.e. the length and width dimensions, of an integrated circuit.

As used herein, the term "a" means at least one.

As used herein, the term "plurality" means more than one.

The present invention is directed to methods of using a feedstock of known good fired-on-foil capacitors to form devices that comprise printed wiring boards [PWB]. The methods described herein make a printed wiring board in which a plurality of singulated capacitors, formed from a single large known good capacitor, are incorporated (in other words, placed or situated), into a build-up layer of a PWB. These methods divide the first and second electrodes of a large, fired-on-foil capacitor previously tested and determined as good into a plurality of electrodes in order to form a plurality of known-good, singulated capacitors. The singulated capacitors are attached to a build-up layer of a printed wiring board, generally by lamination. Since only known good capacitors are used to form PWBs, only known good PWBs are produced. Thus, the present invention results in increased yield of good PWBs.

Specifically, the large, fired-on-foil capacitors are determined as "known good" capacitors at the foil level. The plurality of singulated capacitors formed from these are of a size and a pitch such that: (1) all singulated capacitors are placed directly under and within the dimensions of an IC; and (2) each active (that is, functioning) power and ground terminal of the IC, such as a microprocessor, may be directly connected to the power and the ground electrode of its own, singulated capacitor. Capacitors and PWB circuitry may also be tested at additional points in the embedment process. Testing affirmatively establishes the known good quality of a fired-on-foil capacitor as well as the known good quality of the singulated capacitors made from it. Thus, the PWBs into which singulated capacitors are embedded are also affirmed as known good. Consequently, testing capacitors prior to embedment into the PWB promotes the mounting of ICs and components onto only known good printed wiring boards, which improves the production yield of the final product.

Two General Methods of Forming Embedded Singulated Capacitors

Ultimately, the mechanism underlying the present invention is the formation of singulated capacitors of a size and a pitch such that each active power and ground terminal of the IC can directly connect with vias to the power and the ground electrode, respectively, of its own singulated capacitor. To minimize impedance, all singulated capacitors are placed directly beneath and within the dimensions of the IC. Creating singulated capacitors of known good quality and having sufficiently small size and fine pitch to be so placed has heretofore been beyond the present and conventional art of placing capacitors into PWBs. The methods described herein are therefore not a predictable result arising from such art.

The small size and fine pitch of the singulated capacitors fosters the incorporation into a build-up layer of as many of these capacitors as there are power and ground terminals in the IC, thereby allowing direct connection of each IC power and ground terminal to a power and ground electrode of a different and unique singulated capacitor. The known good quality of each singulated capacitor ensures that the capacitance delivery to the IC terminal is reliable. The placement of multiple capacitors into the build-up layers of a PWB reduces impedance by virtue of minimizing the distance from the capacitor to the IC. In relying on creating a number of known good, singulated capacitors of a certain size and a pitch and having certain yield requirements, which corresponds to the number of active terminals of an IC, the methods described herein incorporate capacitors into PWBs and form PWBs in a way that minimizes impedance and improves product yield not heretofore practiced.

Fired-on-foil capacitors, from which derive the singulated capacitors that will be embedded into the PWB, are made by thin-film techniques of various materials, which includes a ceramic dielectric having a high dielectric constant ("high K") formed on the metal foil, and a metallic electrode.

The following is one way to form and embed a plurality of singulated capacitors: First, fired-on-foil large capacitors are tested and good capacitors are designated as "known good". Identifying the known good capacitors also identifies bad fired-on-foil capacitors. This identification allows for final assembly with an IC and any SMT components to be eliminated for PWBs with bad fired-on-foil capacitors.

Additional metal is now added to the entirety of the capacitor side of the foil to create a metal foil/dielectric/metal sandwich structure. The foil that forms the first electrodes of the fired-on-foil, large capacitors is now patterned by etching, which creates a plurality of first electrodes from each first electrode. The patterned foil is then attached by lamination to a build-up layer of a printed wiring board. The foil that contains the second electrodes of the fired-on-foil capacitors is then patterned by etching to form a plurality of second electrodes from each second electrode contained within the foil. Patterning of the first and second electrodes of the fired-on-foil, large capacitor forms a plurality of singulated capacitors. Etching is a highly accurate process for patterning relative to positioning of singulated capacitors and can yield capacitor electrodes of a very small size, such as having 75 or fewer microns on a side, with each singulated capacitor separated by 75 or fewer microns. This small size, fine pitch and accurate electrode patterning in turn fosters accurate, unique fine pitch connections between the power and ground electrodes of each singulated capacitor and individual power and ground terminals of an IC.

Other techniques, such as sandblasting, laser ablation or other methods, may be employed to pattern the electrodes of the fired-on-foil, known good capacitor to form the singulated capacitors.

Another method for forming and embedding a plurality of singulated capacitors involves dicing the foil containing the fired-on-foil large capacitors. As in the previous method, the fired-on-foil, large capacitors are tested; the good capacitors are designated as "known good"; additional metal is added to the capacitor side of the foil, and the foil forming the first electrode of the fired-on-foil, large capacitor is patterned by etching to form a plurality of first electrodes from each first electrode. The foil containing the fired-on-foil large capacitors (with patterned first electrodes) is then diced, that is, cut up, to form components. The components containing bad large capacitors are discarded leaving only known good components.

The components contain either one or an array of known good, large capacitors, each capacitor having patterned first electrodes. At this point, all components are now known good as they derive from the known good, fired-on-foil large capacitors. The known good components may be positioned by pick and place techniques onto specific locations of a build-up layer of the PWB and attached by lamination of the patterned electrode side to the build-up layer. Since the components are quite large, for example 1.5 cm by 1.5 cm, pick and place techniques can easily handle the components and placement accuracy is very high.

The foil containing the second electrode of the fired-on-foil capacitor is then patterned by etching to form a plurality of second electrodes from each second electrode contained within the foil. It is the patterning of the first and second electrodes that forms a plurality of singulated capacitors.

The dicing methods have certain advantages. Dicing into known good components is particularly useful when a large printing wiring board, such as an 8 inch by 8 inch [20 cm by 20 cm] board, for example, has only one or a few ICs and requires a plurality of embedded high capacitance capacitors in one or a few specific locations.

Another advantage is that diced components containing a bad capacitor may be discarded before being placed on the build-up layer. Thus, only known good components are positioned on the build-up layer and all electrodes of singulated capacitors subsequently connected to IC terminals are derived from a known good capacitor.

Additionally, testing determines not only the quality of "known good" for the fired-on-foil capacitor but also its capacitance tolerance or optionally, other electrical characteristics, that is a measure of its quality. This means that the capacitance tolerance of each diced component is also known. Therefore, the dicing method allows that, prior to placing the diced components onto the build-up layer, the diced component may be sorted according to capacitance tolerance, for example, as 5%, 10% or 20% from target value. This allows incisive placement of those diced components having a certain tolerance into particular locations in the build-up layer, which tailors capacitance to a specific location or for a specific application.

Incorporating Singulated Capacitors into Build-Up Layers of a PWB

Following is a description of incorporating into the build up layer of a PWB a plurality of singulated capacitors derived from known good, thin-film, fired-on-foil large capacitors using a method that facilitates accurately placed, singulated capacitors to be small in size with a fine pitch consistent with the needs of an IC with multiple, active power and ground terminals.

Figure 3A:
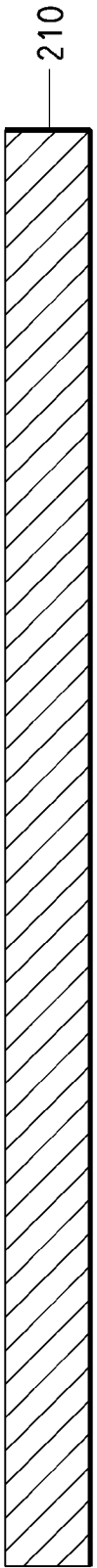
FIG. 3A-3H illustrate a method of making thin-film fired-on-foil capacitors wherein the foil has been patterned to create antipads within the footprint of a known good capacitor electrode.

FIG. 3A is a side elevational view of a first stage of embedding singulated capacitors into the build-up layers of a printed wiring board. In FIG. 3A, a metallic foil 210 is provided. Foil 210 will become the first electrode of the fired-on-foil capacitors. The foil 210 may be of a type generally available in the industry. For example, the foil 210 may be copper or its alloys, copper-invar-copper, invar, nickel, nickel-coated copper, or other metals that have melting points in excess of the firing temperature for thin-film dielectrics. Preferred foils include foils comprising predominantly copper or nickel. The thickness of foil 210 may be in the range of, for example, between 1 and 100 microns, preferably between 3 and 75 microns, and most preferably between 12 and 36 microns. An example of a suitable copper foil is PLSP grade 1 ounce (36 microns thick) copper foil obtainable from Oak-Mitsui. An example of a suitable nickel foil is Nickel foil 201 obtainable from Allfoils.

Figure 3B:
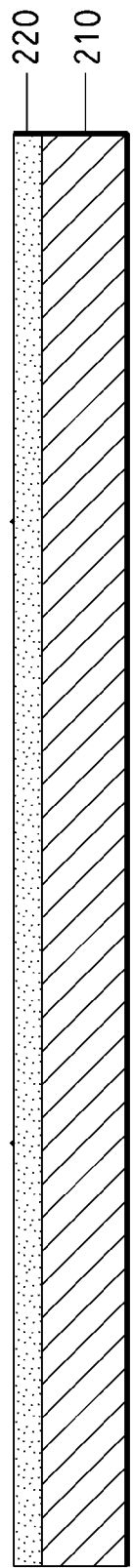

In FIG. 3B, capacitor dielectric material is deposited onto foil 210 to form capacitor dielectric layer 220. The capacitor dielectric material may be deposited, for example, by coating the foil with a chemical solution of a suitably high dielectric constant material. The dielectric material may be doped to achieve reliability and other desired properties. U.S. application Ser. No. 11/157,894 and U.S. App. Pub. No. US-2006-0287188-A1 are hereby incorporated herein by reference. Other methods of depositing the dielectric include sputtering or chemical vapor deposition or combinations of these.

Capacitor dielectric layer 220 is then fired. The firing temperature depends on the melting point of the underlying metallic foil and the desired microstructural development. The range of firing temperature can be between the temperature just above which the dielectric begins to crystallize and the temperature just below the melting temperature of the underlying metallic foil. For example, the dielectric crystallizes during firing in the temperature range of 500-700° C. Further heating densifies the dielectric and promotes grain growth. A suitable upper firing temperature for copper is approximately 1050° C. and for nickel, it can be 1400° C., which depends on the melting points of each. Thus, the range of the firing temperature is most likely between 700° C. to 1400° C., but may extend outside these limits depending on the above parameters.

Firing is done under a protective or reducing atmosphere sufficiently low in oxygen to protect the metal foil from oxidation. The specific atmosphere will depend upon the temperature and the underlying metallic foil and can be thermodynamically derived from standard free energy of formation of oxides as a function of temperature calculations or diagrams as disclosed in publication "F. D. Richardson and J. H. E. Jeffes, J. Iron Steel Inst., 160, 261 (1948). For example, using copper as the underlying metallic foil, firing at 700° C., 900° C. and 1050° C. would require partial pressures of oxygen (PO2) of approximately less than $4 \times 10^{-11}$, $3.7 \times 10^{-8}$, and $1.6 \times 10^{-6}$ atmospheres, respectively, to protect the copper from oxidation.

Figure 3C:
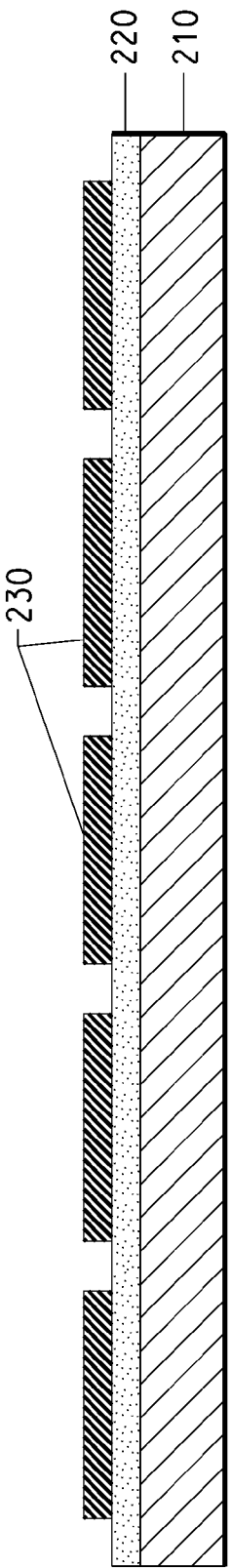

In FIG. 3C, second electrodes 230 are formed over fired dielectric layer 220 to form fired-on-foil (i.e. large) capacitors by, for example, sputtering or other methods. Typically the sputtered second electrode will be approximately the same size as the IC for which it is designed, for example between 1.0 and 3 cm on a side and less than 1 micron in thickness and its metallurgy will be copper but any metal may be used.

When the size of the large, single capacitor approximates that of the PWB into which it will be embedded, the area of second electrode layer 230 is generally made slightly smaller than that of the printed wiring board. This accommodates any misregistration between the foil, dielectric layer and the electrode layer owing to imprecise dielectric deposition or sputtering. For example, if the printed wiring board is 20 mm by 20 mm, second electrode layer 230 may be slightly smaller, such as 19 mm by 19 mm.

Figure 3D:
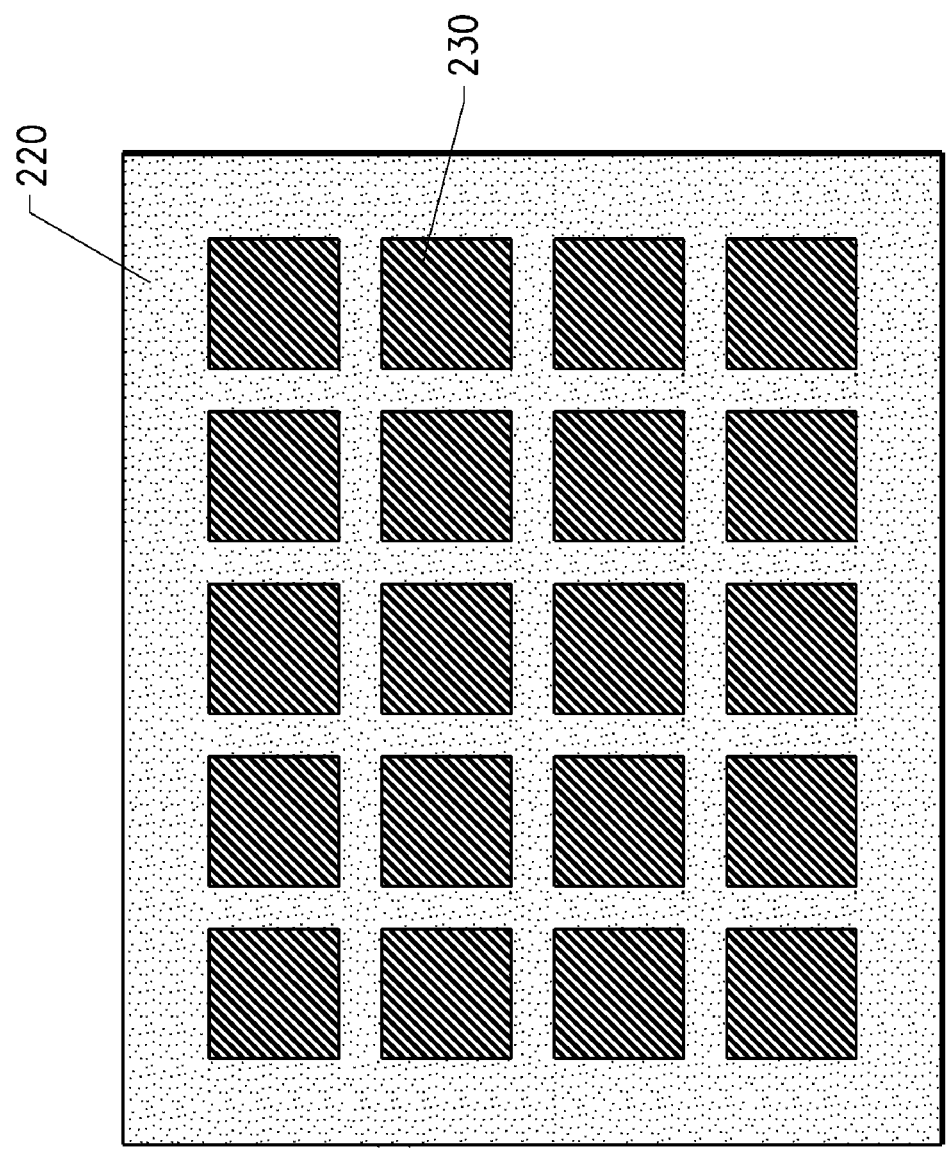

FIG. 3D is a plan view of the fired-on-foil, large capacitors shown in the cross-section of FIG. 3C. Twenty large capacitors are shown, each having second electrode 230 on dielectric layer 220 on foil 210 (the foil is not shown due to 100% dielectric coverage). Any number of large capacitors can be formed on foil 210 in various patterns, depending on capacitor size, printed wiring board dimensions and capacitor locations per board, which is in the ordinary skill of the art.

Figure 3E:
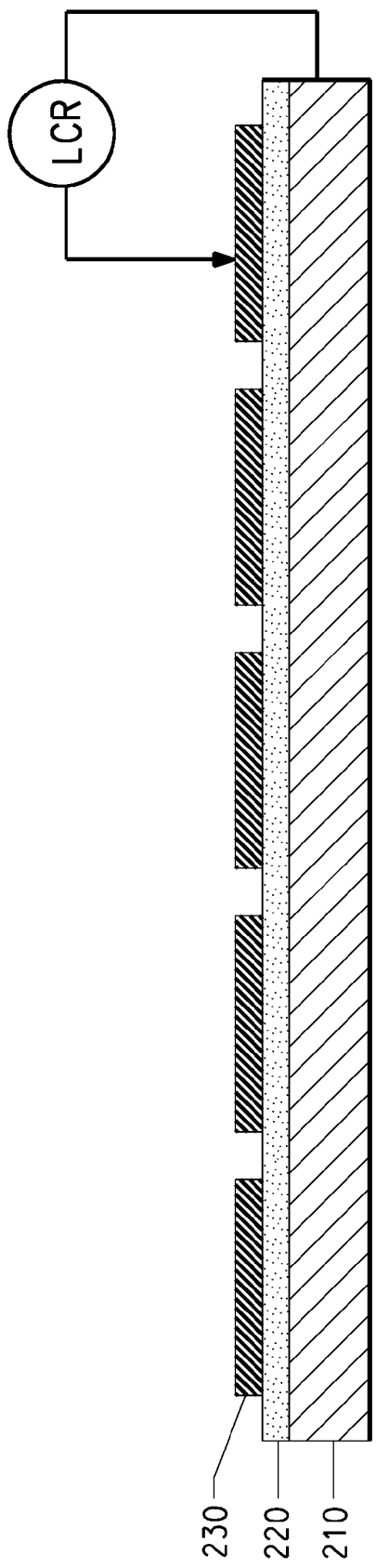

Referring to FIG. 3E, at this stage, the fired-on-foil, large capacitors can be tested with an LCR meter for capacitance. Testing identifies the locations of known good, large capacitors. For example, each foil may be divided into a grid of subparts, each subpart having a unique address, thereby uniquely identifying the location of each large capacitor. If a tested, large capacitor is shorted or otherwise defective, since its location is known, final assembly with an IC and any SMT parts may be eliminated. If the yield of large capacitors on the foil is low, the foil containing the fired-on-foil large capacitors can be discarded. This allows for high yield in the final product.

Figure 3F:
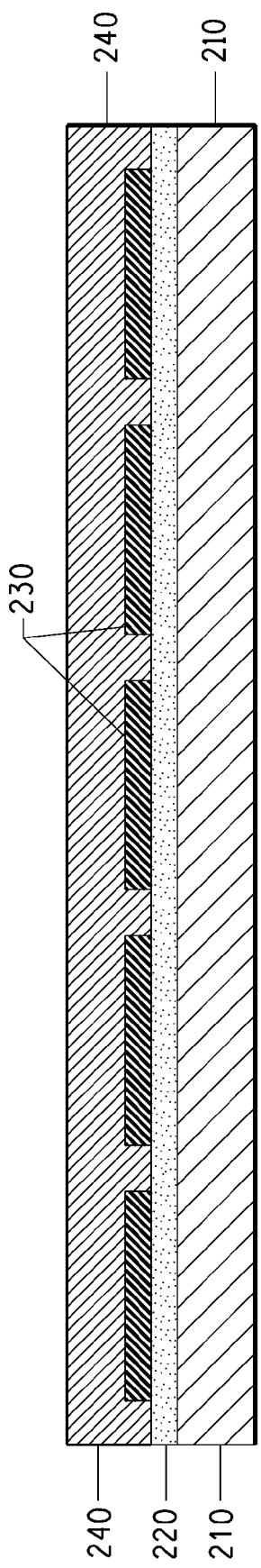

In FIG. 3F, additional metal is added to the side of the foil containing the fired-on-foil, large capacitors and second electrode 230 to form metal layer 240. This may be accomplished by sputtering a seed metal layer, generally copper, and then plating up with additional copper to the desired thickness. Other methods of adding the additional metal to form layer 240 may also be practiced. Metal layer 240 is designed to provide added strength to the structure to accommodate subsequent processing. The thickness of layer 240 can be between 15 and 35 microns or between 4 and 10 microns or between 4 and 30 microns. For clarity, the figures continue to show second electrode 230 even though in practice, second electrode 230 is now incorporated into layer 240.

Photo-resist is now applied to foil 210. A carrier film may also be applied to layer 240. The carrier film provides additional strength to the foil and will protect layer 240 from subsequent handling and processing and will also serve as an etch resist. The photo-resist applied to foil 210 is imaged and developed and foil 210 etched and the remaining photo-resist is stripped. Being protected by the carrier film, layer 240 remains unetched.

Figure 3G:
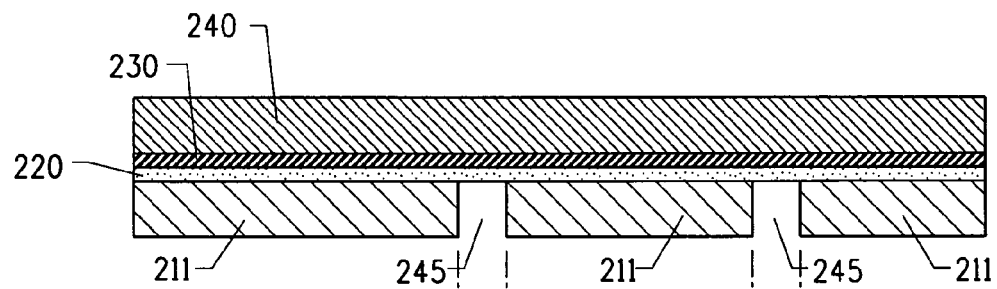

FIG. 3G depicts an enlargement of one section of etched article of FIG. 3F wherein only one large electrode 230 of a known good capacitor is shown. Etching patterns foil 210 and creates common first electrode 211 that will function as multiple ground (first) electrodes of the multiple singulated capacitors. The etching also creates antipads (or holes) 245 in first electrode 211 for via connections to the second (top) electrode and to the top signal pads. Each known good, large capacitor will have the required number of antipads 245 per IC within the footprint (or area) of original second electrode 230 and within first electrode 211. First electrode 211 may be made slightly larger than second electrode 230 but the common area of the known good capacitor electrodes is defined by second electrode 230.

Figure 3H:
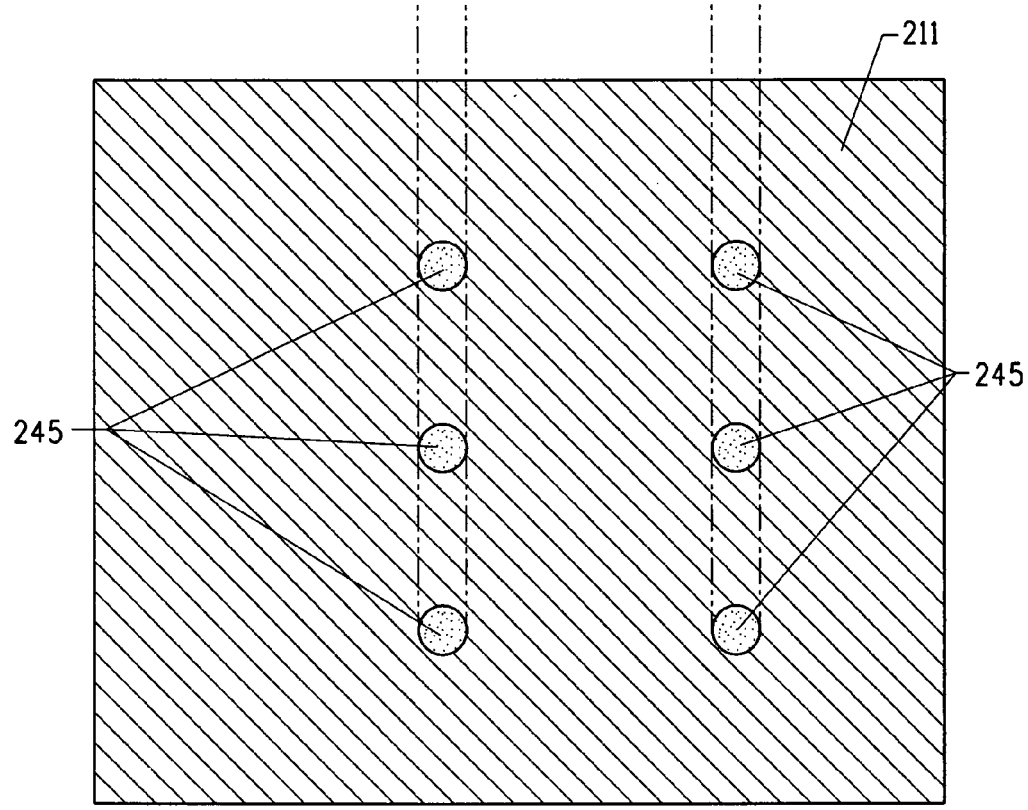

FIG. 3H shows a plan view of the bottom side of patterned foil 210 of FIG. 3G. Shown here are six antipads 245 fabricated within the original footprint of the known good capacitor second electrode 230 and within first electrode 211. Fabricating features 245 within the dimensions of second electrode 230 and within electrode 211 of the known good, large capacitor ensures that known good, singulated capacitors will result. Here, electrode 211 is a common electrode, functioning as three ground electrodes for three singulated capacitors but individual (separated) ground electrodes may also be created.

Figure 4A:
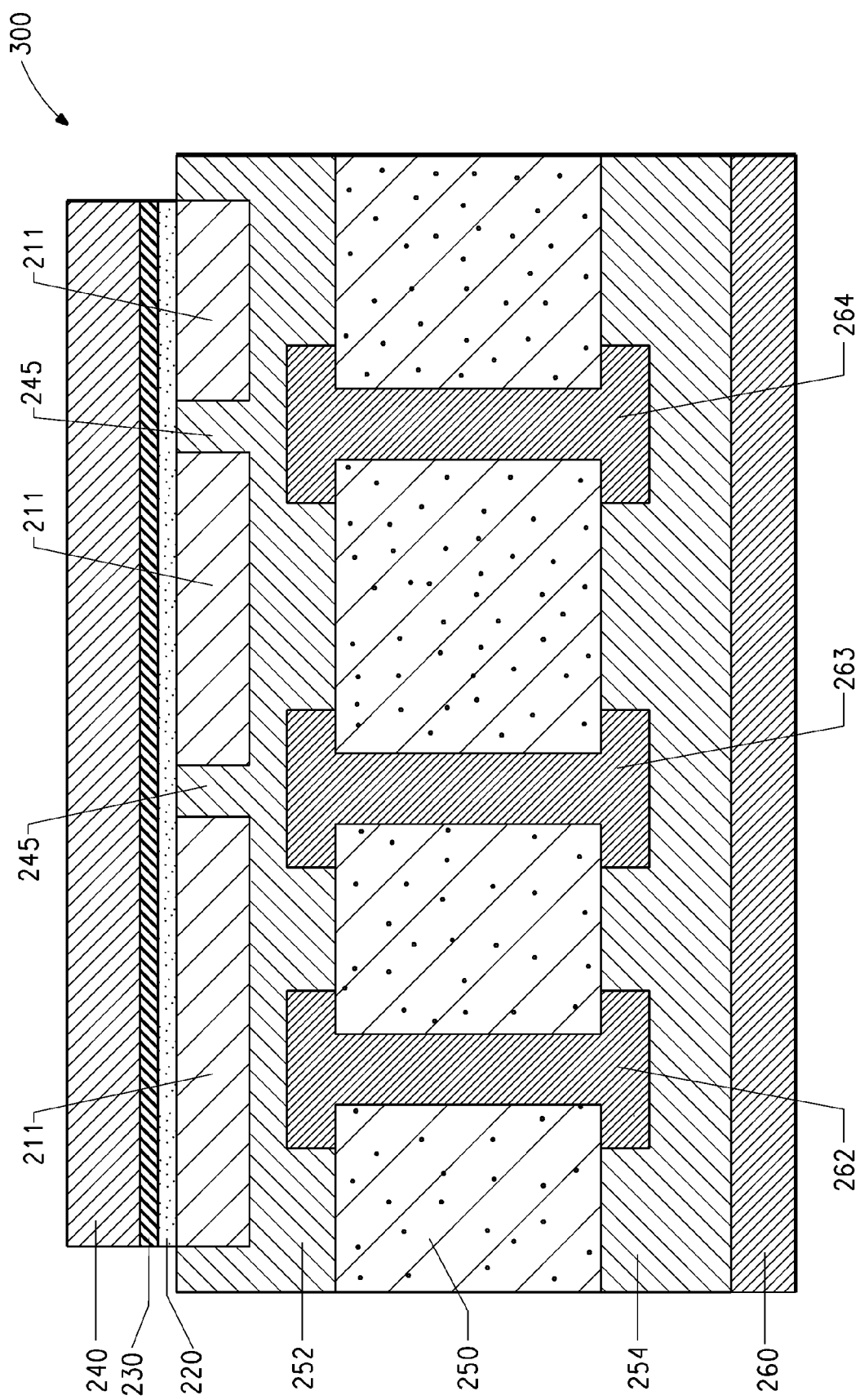
FIG. 4A-4D illustrate methods of incorporating a plurality of thin-film fired-on-foil singulated capacitors derived from a known good capacitor into the build-up layers of a printed wiring board.

FIG. 4A shows in cross section that first common ground electrode 211 with antipads 245 is laminated to build-up layer 252 of a printed wiring board to form structure 300. Structure 300 comprises core laminate 250 containing through hole vias 262, 263 and 264 and at least one build-up layer 252 and 254 on either side of laminate 250. Copper foil 260 is also typically laminated to build-up layer 254 to better balance the structure by providing symmetry. Foil 260 may be a foil that does not and is not intended to contain a capacitor. Any carrier film that may have been applied previously to layer 240 is removed. For clarity, structure 300 shows the position of the known good capacitor second electrode 230 within layer 240 so that one may observe how subsequent patterning of layer 240 forms features that reside within the footprint of second electrode 230. The size of the finished printed circuit board may be slightly or significantly larger than the area of first electrode 211.

The build-up layers may be arranged either symmetrically or not around the laminate core. Any number of build-up layers may be applied and any number of foils containing capacitors may be incorporated into the build-up layers. The build-up layers may be laminated as a dielectric film, spin-coated or curtain coated as a liquid, or applied as a resin coated on a metallic layer (for example copper foil) or as a reinforced prepreg, for example B-stage resin.

Suitable lamination conditions may be 185° C. at 208 psig for 1 hour in a vacuum chamber evacuated to 28 inches of mercury. A silicone rubber press pad and a smooth PTFE filled glass release sheet may be in contact with foils 240 and 260 to prevent the epoxy from the build up layers from gluing the lamination plates together. Resulting structure 300 is encapsulated by foil 240 on one side and foil 260 on the other.

After lamination, a photo-resist is applied to foil 240 containing second electrode 230 and to foil 260. The photo-resist is imaged, developed and the metal foils are etched. The photo-resist is stripped using standard printing wiring board processing conditions to form article 325 of FIG. 4B. Etching patterns foil 240 and forms a plurality of circular trenches 271 in the foil. The etching also forms common second electrode 270, that will function as multiple power electrodes of the multiple singulated capacitors. The etching also creates copper pads 272 for signal connection and pads 274 for via connection to the bottom electrode. Features 270, 271, 272 and 274 are within the footprint of original second electrode 230 of the known good, fired-on-foil large capacitor, thereby ensuring all singulated capacitors are formed from a known good, large capacitor. Patterning foil 240 by etching completes the formation of the plurality of singulated capacitors.

Figure 4B:
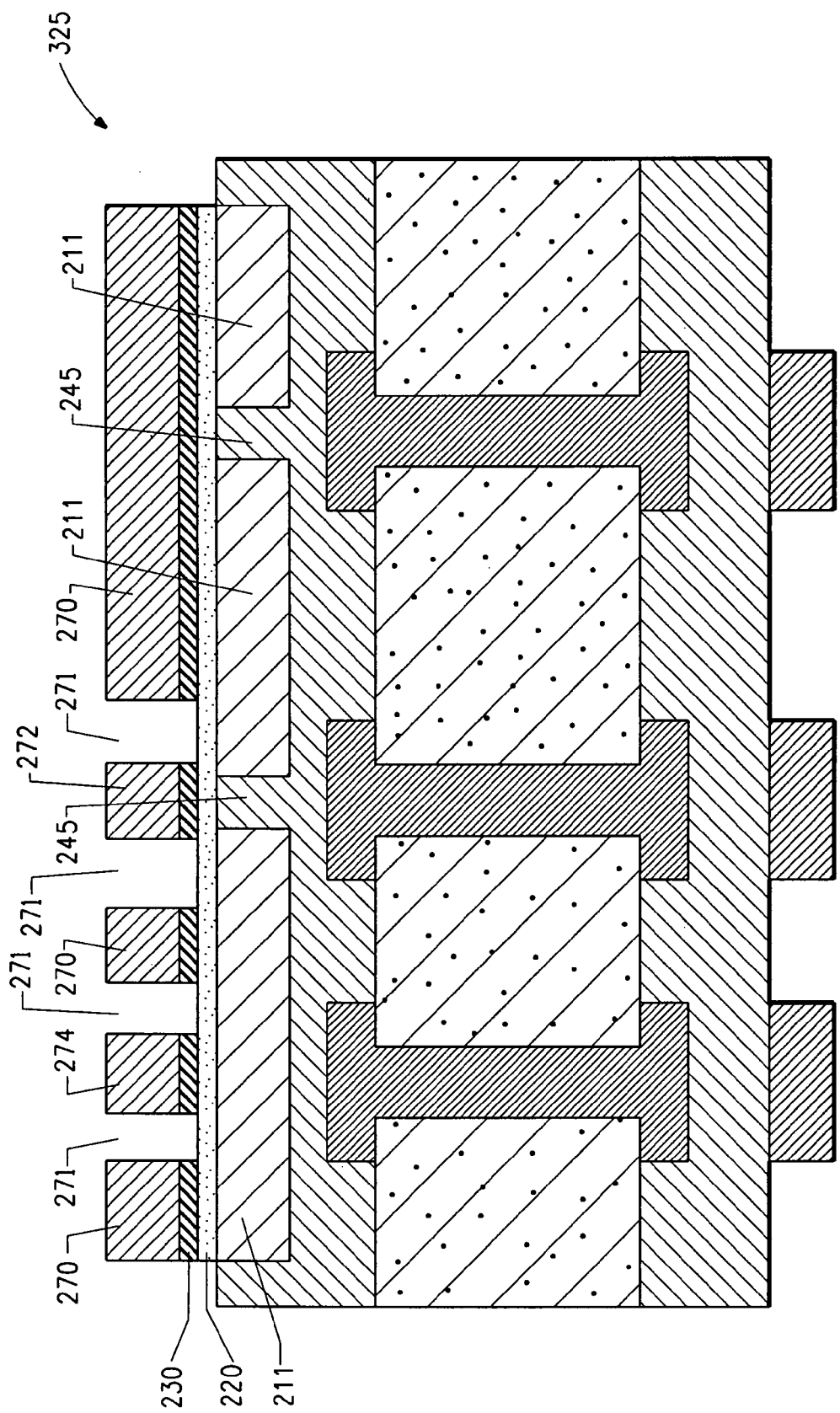
Figure 4C:
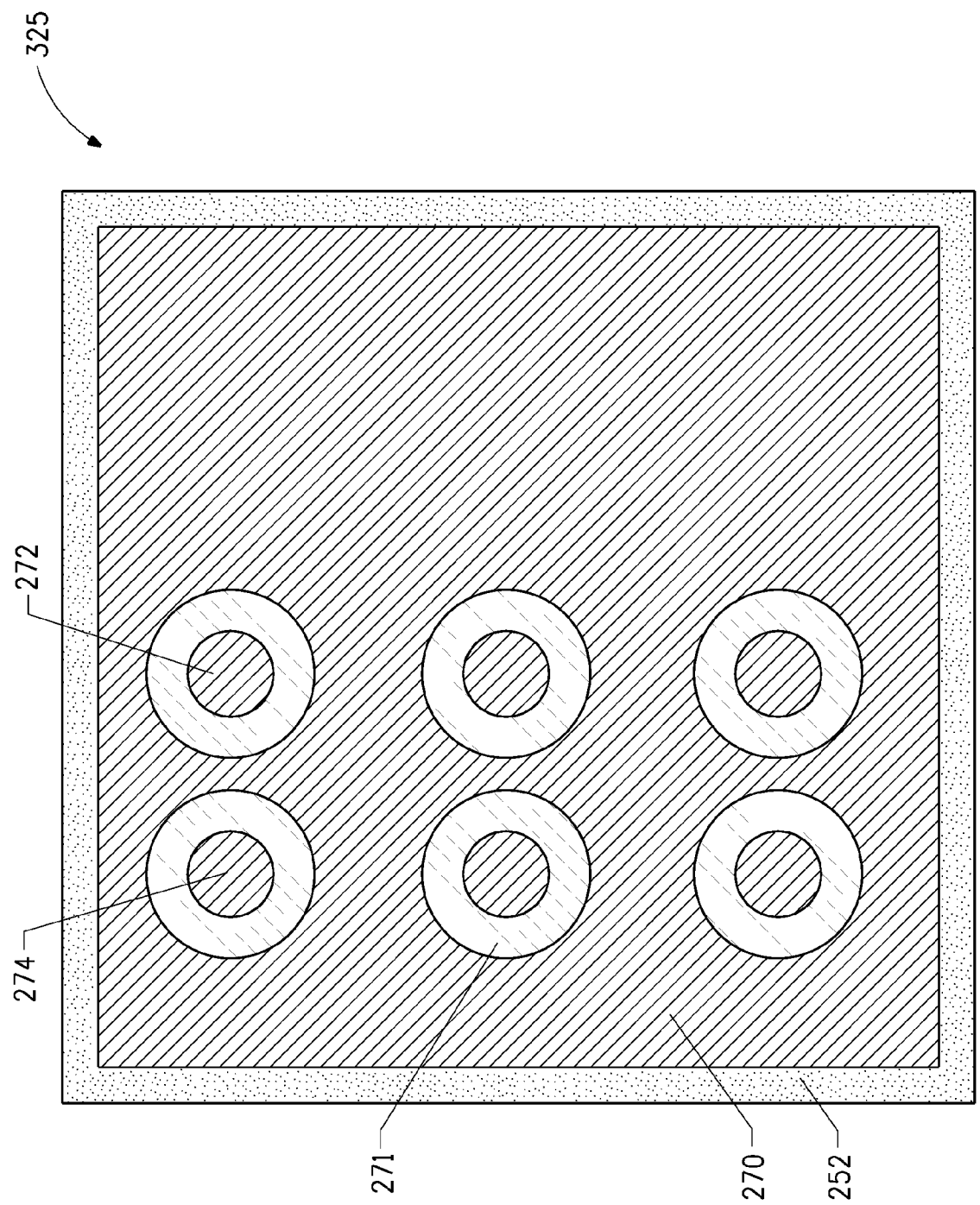

FIG. 4C shows a top plan view of structure 325 having 6 circular trenches matching the design of patterned foil 210 shown in FIG. 3H. The number of circular trenches shown here is exemplary and if the IC requires more singulated capacitors than shown, foil 210 may be patterned with more antipads, and a matching number of circular trenches may be formed in foil 240 within the footprint of original second electrode 230. Here, electrode 270 is a common electrode functioning as three power electrodes for three singulated capacitors. However, individual (separated) power electrodes may be patterned from foil 240.

Figure 4D:
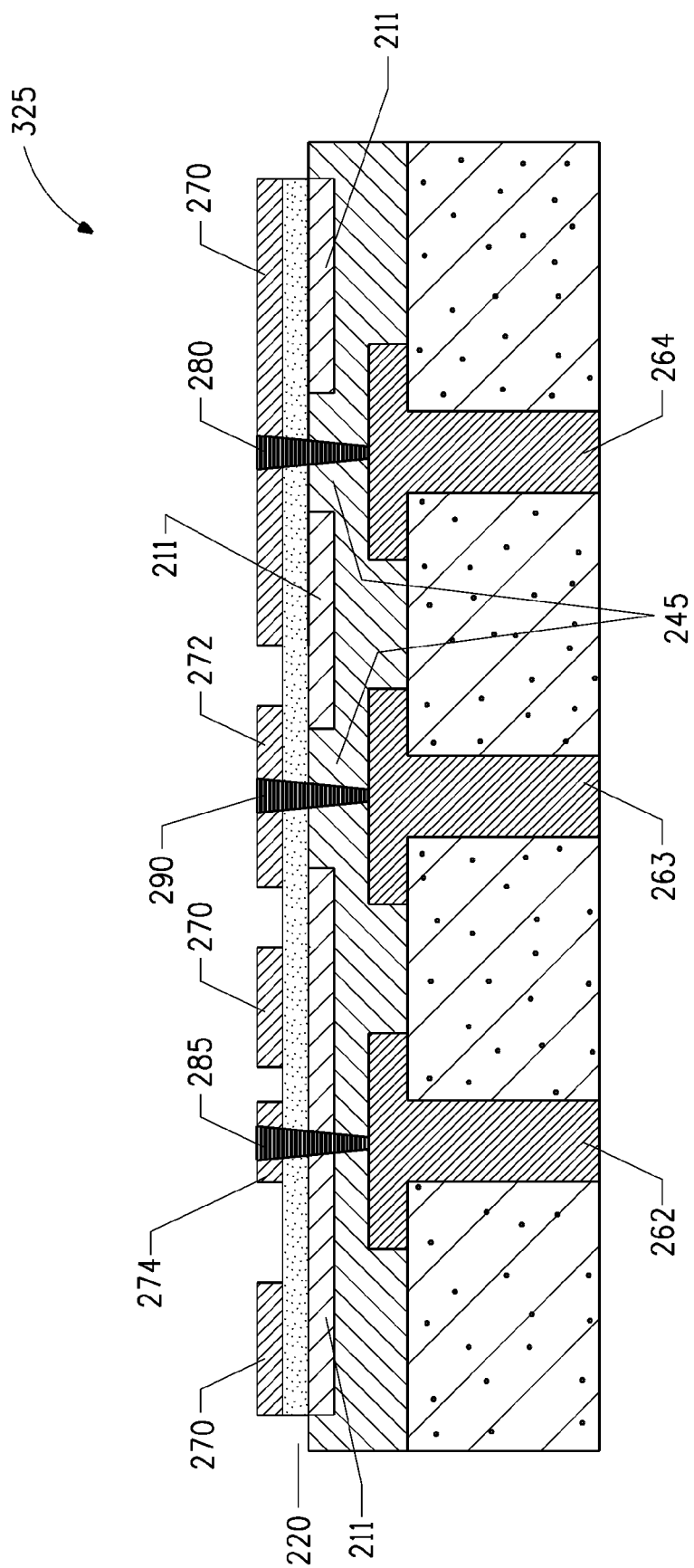

FIG. 4D is a magnification of article 325 in FIG. 4B, wherein only the top portion is shown. Microvias 280 and 285 are formed through electrode 270 and pads 274, respectively, and plated to interconnect the top electrode 270 and bottom electrode 211, respectively, to the through hole vias 264 and 262 of the laminated core. Microvia 290 is also formed through pad 272 which is isolated from electrodes 270 and 211, and plated to interconnect the signal pad 272 to the through hole via 263 of the laminated core. The design as shown here has no unsupported dielectric layer 220 and is preferred for structural reasons but other designs may be used. Microvias 280, 285 and 290 can be formed by laser drilling, by photolithography, or by controlled-depth mechanical drilling. Initial metallization of the microvia hole-walls is achieved by depositing a metal seed layer, for example electroless copper, which can be activated by a catalyst, for example, palladium, deposited on the surface. Additional build-up layers may be applied to incorporate the singulated capacitors deeper within the PWB and finally the outer circuitry may also be plated, for example, with nickel and gold to finish the PWB.

The sequence of steps shown in FIGS. 3 and 4 is not unvarying but may be adjusted. For example, microvias 280, 285 and 290 may be formed prior to patterning foil 240.

Dicing to Form Known Good Components

FIGS. 5A-5G illustrate an alternative method of incorporation into the build-up layers of a printed wiring board of a plurality of thin-film singulated capacitors, derived from a known good, large capacitor. In essence, this method dices the foil containing the fired-on-foil capacitors into components containing one or more large capacitors and attaches only known good, fired-on-foil large capacitors to a build-up layer of a PWB. The second electrode is then patterned by etching into a plurality of electrodes and thereby forming the plurality of singulated capacitors.

FIG. 5A shows the article of FIG. 3G but with three fired-on-foil second electrodes 530 within metal layer 540 on dielectric layer 520, formed on copper foil. The foil has been patterned to form first electrode 511 and antipads 545.

Dicing the structure of FIG. 5A creates individual diced component 500 as depicted in side elevation in FIG. 5B and in plan view in FIG. 5C. FIG. 5B shows dicing to form component 500 with one fired-on-foil, large capacitor but an alternative method may dice the foil into components containing more than one capacitor. This alternative method is useful when more than one IC is to be attached to the PWB and each large capacitor will service one IC. Dicing is typically done with a diamond saw but any suitable apparatus or method may be employed.

After dicing, those components containing capacitors tested as not good are identified and discarded. Those components containing known good large capacitors may be sorted into their respective capacitor tolerances according to their previous tested capacitance data.

FIG. 5C shows only six antipads 545 formed in first electrode 511 but any number of these features, depending upon IC capacitor needs, may be formed within first electrode 511 and within the footprint of the original second electrode 530 (FIG. 5A). FIGS. 5B and 5C show only three diced components but a foil structure containing fired-on-foil, large capacitors may be diced into any number of components depending on the number of fired-on-foil capacitors on the foil and the number of capacitors desired per component.

Figure 5D:
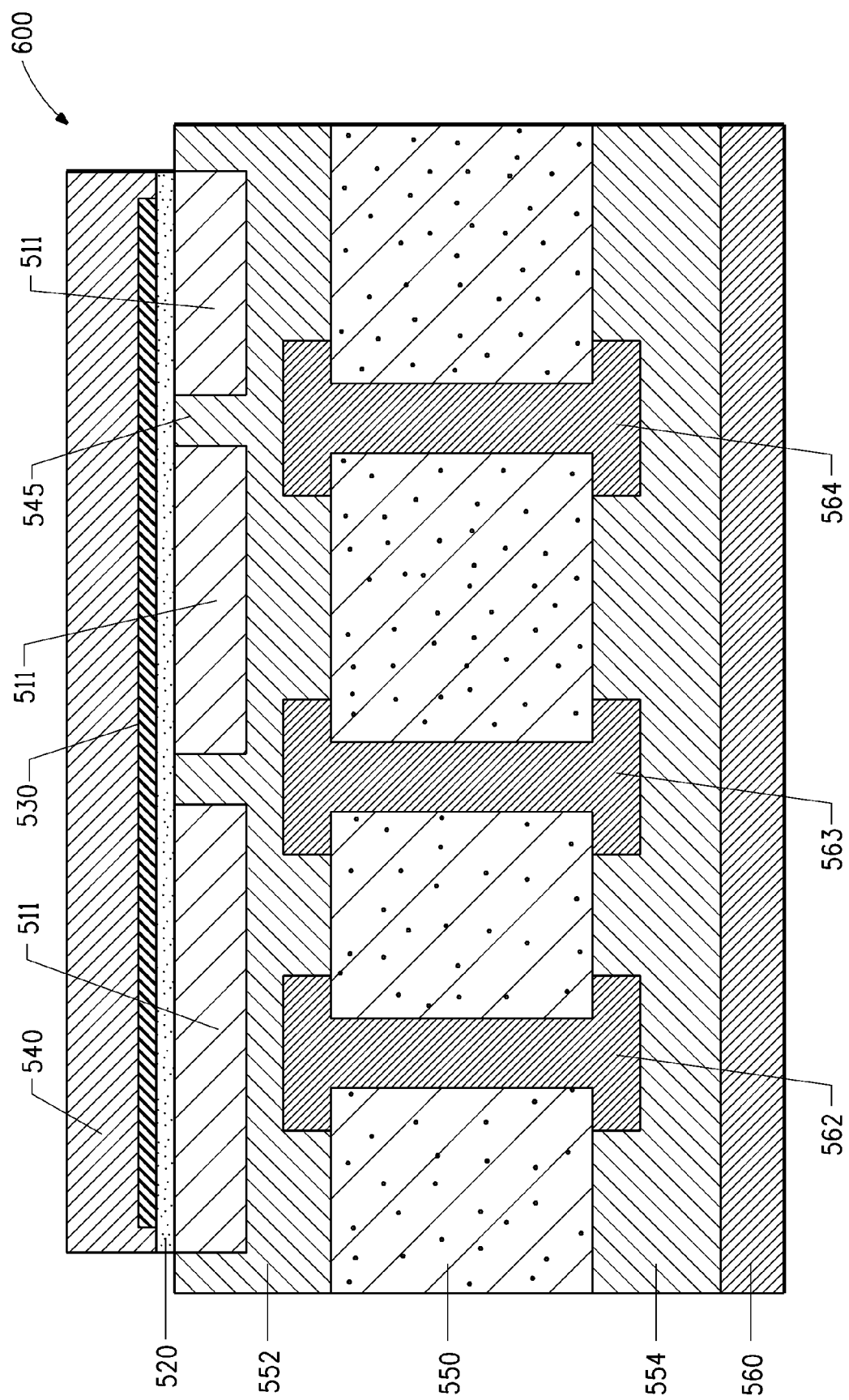
Figure 5E:
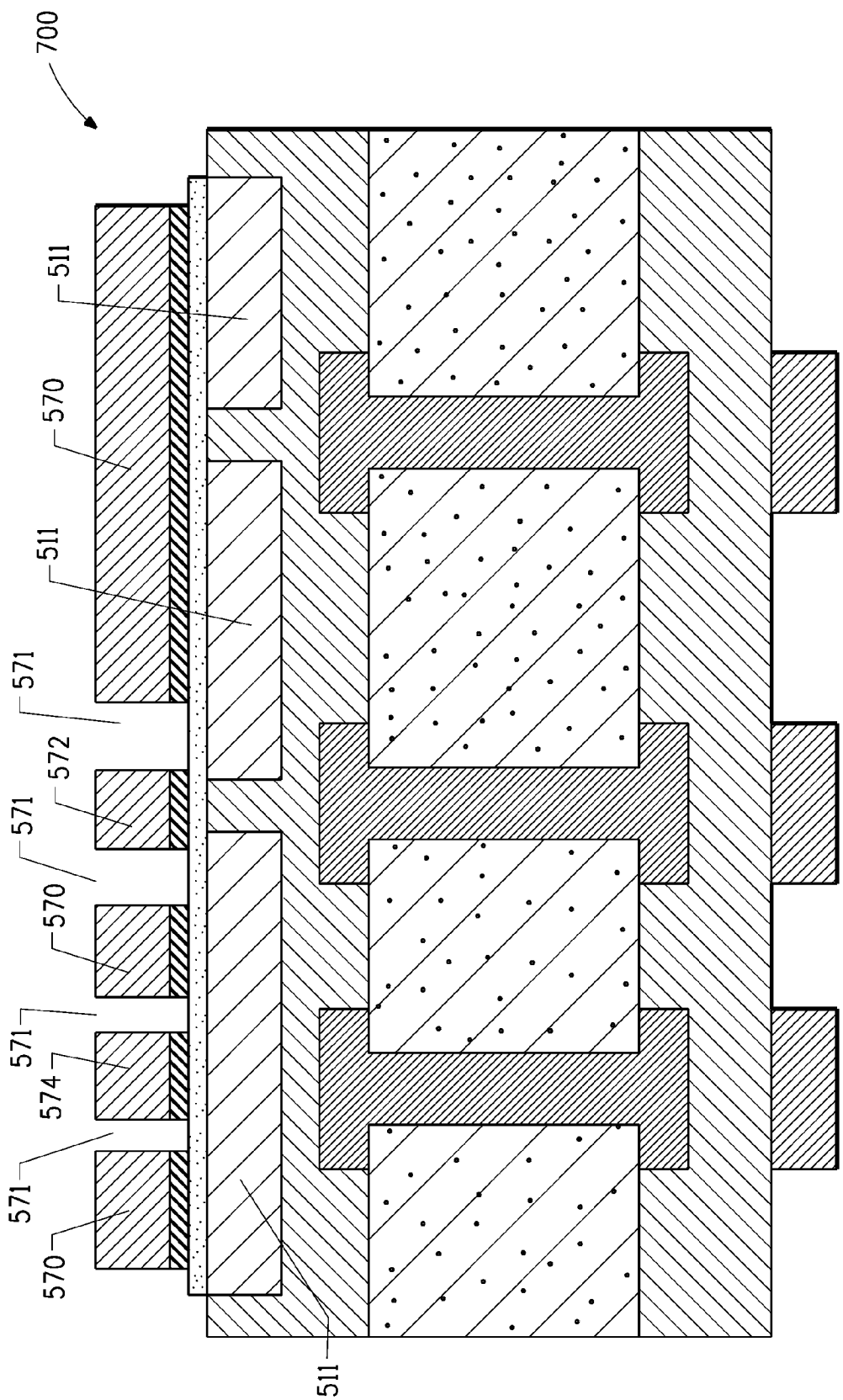

FIG. 5D shows known good component 500 (FIG. 5C) incorporated into build-up layer 552 of a PWB. This is done by pick and place techniques onto a desired position and then laminating the component from its patterned first electrode side to the build-up layer to create structure 600. Lamination occurs as described previously. Printed wiring board structure 600 comprises core laminate 550 containing through hole vias 562, 563 and 564 and at least one build-up layer 552 and 554 on either side of core laminate 550.

Typically, a copper foil 560 is also laminated to build-up layer 554 to better balance the structure by providing symmetry. The carrier film that may have been applied previously to layer 540 is also removed. Although FIG. 5D shows only one singulated capacitor placed on 552 and incorporated into a printed wiring board, any number of components may be placed in any specific location on build-up layer 552 of a printed wiring board depending on circuit design needs and size of the printed wiring board.

Figure 5F:
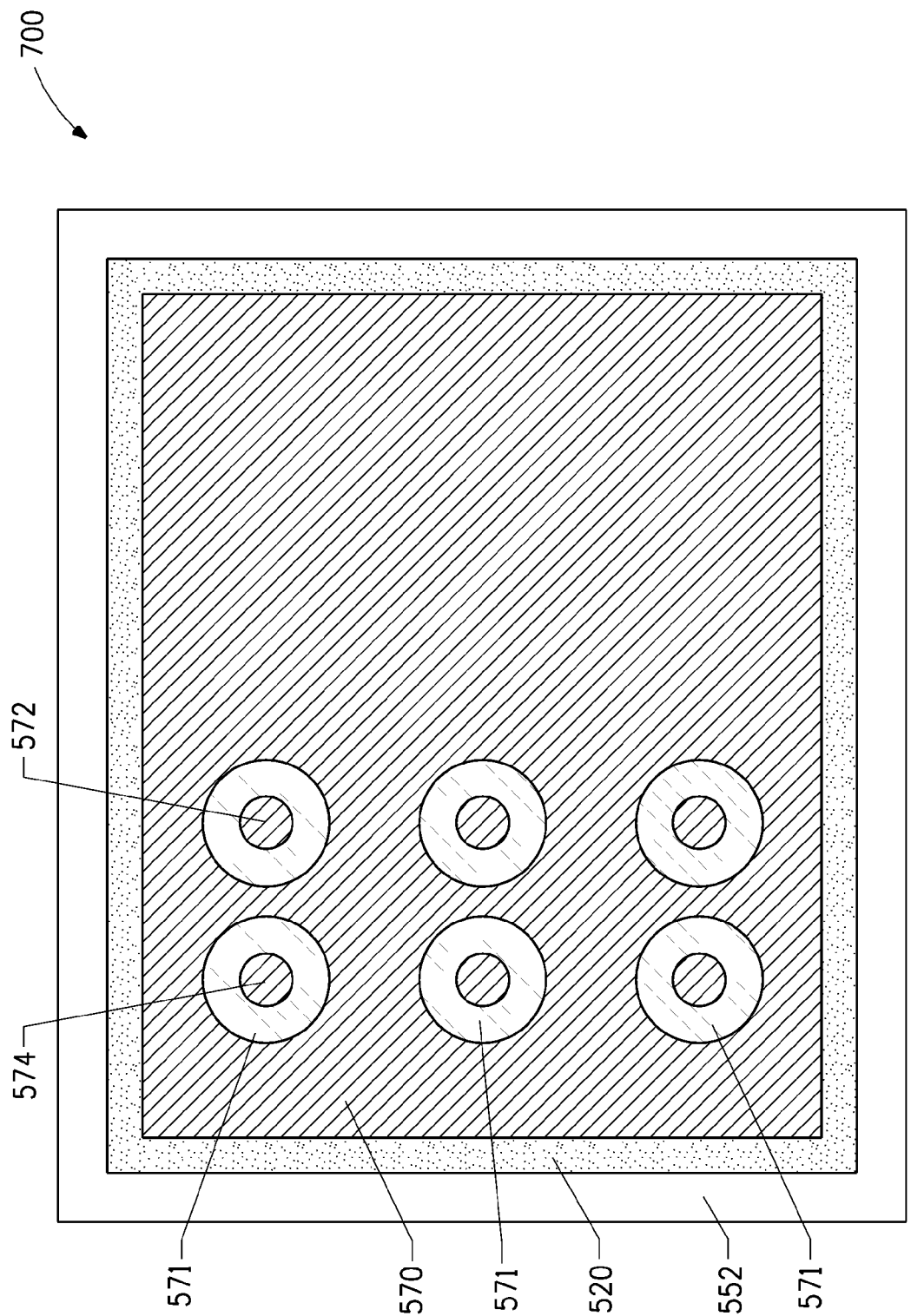
Figure 5G:
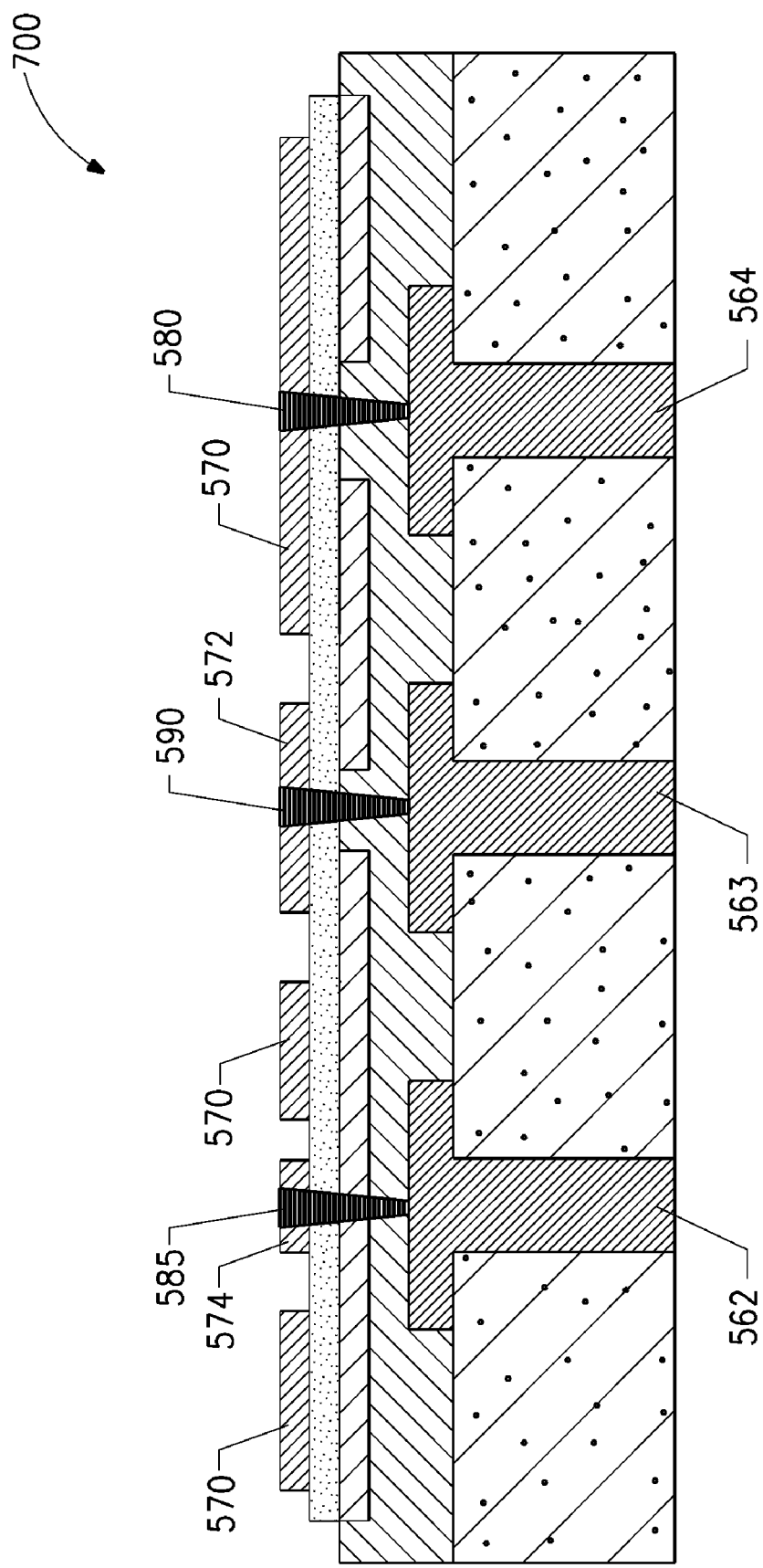

After lamination, a photo-resist is applied to foils 540 and 560. The photo-resist is imaged, developed and the metal foils are etched. The photo-resist is stripped using standard printing wiring board processing conditions to form article 700 of FIG. 5E. Etching patterns the foils and forms a plurality of circular trenches 571, top common (second) electrode 570, copper signal pads 572 and copper pads 574 for connections to the bottom electrode. Features 570, 571, 572 and 574 are within the footprint of original second electrode 530 (FIG. 5D) of the known good component so as to ensure all singulated capacitors derived from the known good component are good. Patterning of the foil 540 (FIG. 5D) completes the forming of the plurality of singulated capacitors. FIG. 5F shows a top plan view of structure 700 having 6 circular trenches, the number matching the design of the patterned foil shown in FIG. 5C. However if the IC requires more singulated capacitors, the foils may be patterned with more antipads and circular trenches within the footprint of original second electrode 530. As shown, electrode 570 is a common electrode functioning as three power electrodes for three singulated capacitors but individual (separated) power electrodes may be created FIG. 5G shows an enlargement of the top portion of FIG. 5E. Microvias 580 and 585 are formed and plated to interconnect the top and bottom electrodes respectively to the appropriate through hole vias 564 and 562 of the laminated core. Microvia 590 is also formed and plated to interconnect the signal pad 572 to the appropriate through hole 563 of the laminated core. As in the previous example, no unsupported dielectric exists in this design. Microvias 580, 585 and 590 can be formed by laser drilling, by photolithography, or by controlled-depth mechanical drilling. Initial metallization of the microvia hole-walls is achieved by depositing a metal seed layer, for example electroless copper. The seed layer deposition may be activated by a catalyst deposited on the surface, for example in one embodiment, palladium, may be used. The outer circuitry may also be plated with, for example, nickel and gold at this time to finish the article. As described previously, the process of forming microvias 580, 585 and 590 may precede patterning foil 540.

Figure 6:
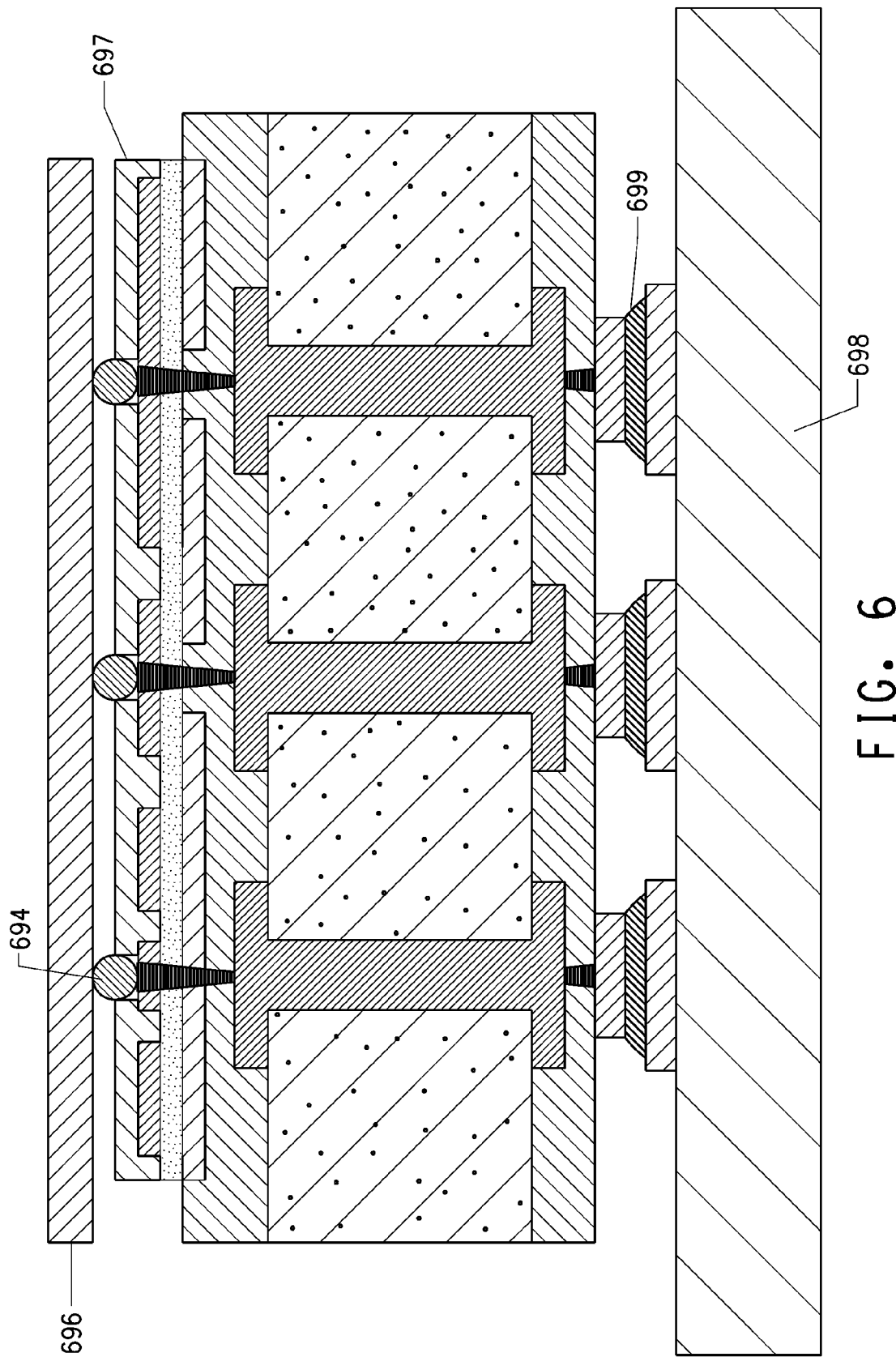
FIG. 6 depicts in section view a PWB into which thin-film capacitors have been incorporated by methods described herein and which have been directly connected to the bumps of a flip chip IC and connected to a printed wiring mother board by solder joints.

The printed circuit boards of FIGS. 4D and 5G may be connected to the bumps of a flip chip IC and connected to a printed wiring mother board. FIG. 6 illustrates a cross-section of a printed circuit board with a thin-film capacitor embedded into the build up layers that has been connected to a flip chip IC. The printed circuit board of FIGS. 4D and 5G has been finished with an organic cover coat 697 to protect the outer metal surface of the PWB and define the area of connection of bumps 694. The printed wiring board is approximately the same size as the IC, thereby having all singulated capacitors within the dimensions of the IC. A signal terminal of the IC is connected to an isolated pad which is interconnected to the core. The power terminal of the semiconductor is directly connected to an electrode of the singulated capacitor and the ground terminal of the flip chip IC is directly connected to the other electrode. Connection of the bumps 694 of the flip chip IC 696 to the PWB is generally accomplished in a high temperature soldering step. The PWB is then connected to the printed wiring mother board 698 via solder joints 699 in a lower temperature soldering step.

Core-Less Variation

Moreover, these methods include a variation of the steps shown in FIGS. 3, 4 and 5, which does not result in a core structure. Specifically, the structure containing the thin-film capacitors in the outer layer(s), also known as build-up layer(s), need not be constructed as a core around which outer layers are added sequentially. Rather, it may be formed as a "coreless" structure, which can be made by circuitizing individual layers in parallel either simultaneously or jointly. In other words, the coreless structure may be formed either by laminating individual layers into a multilayer structure in a single lamination step or by positioning one build-up layer on top of the previous one in sequential steps.

One such example of a "coreless" structure, built in parallel, is the Any Layer Interstitial Via Hole (ALIVH) process (available through Matsushita). The ALIVH process may also incorporate thin film planar capacitors. Other examples of "coreless" structures built in parallel include the Neo Manhattan Bump Interconnection (NMBI) (North Corp.), and patterned prepreg lay-up process (PALAP)(Denso Corp.). Examples of core-less structures built sequentially include the B$^2$it® process (available through Toshiba Corporation) and the FVSS process, "free via stacked-up structure", (Ibiden Corp.) where planar capacitors can be incorporated in similar fashion.

The benefit of "coreless structures" is the presence of microvias in all layers. This allows wiring (i.e., interconnects) between two points on different layers by the shortest possible path through the use of a combination of staggered and stacked microvias. In contrast, a core structure has plating throughholes (PTH) that connect metal layers in the core. The PTHs have larger diameter holes than microvias and require more space for a given interconnect than microvias. Therefore, they cannot achieve the high wiring density of microvias. In addition, in a core structure having, for example, four metal layers, a connection between metal layers one and two requires that the PTH be drilled through all four layers, not only the two connected layers, which wastes real estate on the unconnected layers. In addition, the unnecessary metal connection to layers three and four, the so-called "via stub", creates undesirable parasitic electrical effects.

If the printed wiring board with thin-film capacitors is larger in area than the semiconductor device, additional passive components, such as resistors, may be added to the surface of the printed wiring board to provide functions not supplied by the embedded capacitors.

EXAMPLES

Example 1

Figure 7:
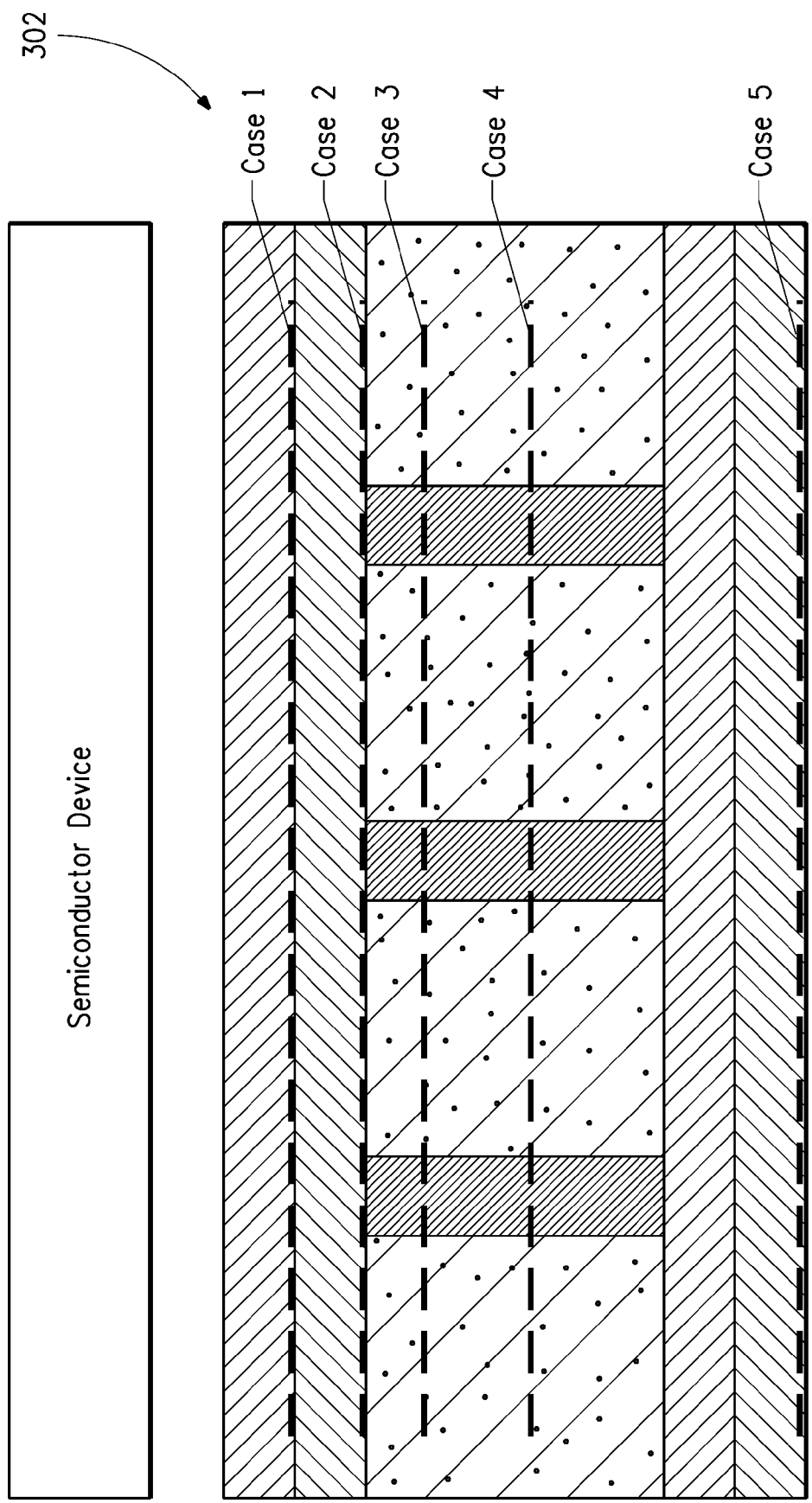
FIG. 7 depicts in section view locations of five capacitors incorporated into a core and build-up layers of a PWB by methods described herein.

Table 1 shows via inductance data observed as a function of via length (in microns) for five capacitors placed in different locations in the build-up semiconductor printed wiring board package structure of FIG. 7. Via length is the connection distance between each capacitor and the terminals of the IC and is measured in microns. Total via inductance is measured in picoHenries [pH]. The inductance data was obtained from circuit measurements on test vehicles having 2 mm square capacitors placed in the five different locations in the PWB.

TABLE 1

Via Inductance as a Function of Via Length

| CASE NO. | VIA LENGTH—μm | TOTAL VIA INDUCTANCE—pH |
|---|---|---|
| 1 | 38 | 6 |
| 2 | 76 | 19.74 |
| 3 | 171 | 70.6 |
| 4 | 376 | 123.56 |
| 5 | 752 | 319.48 |

The structure in FIG. 7 has a core layer and double sided build-up layers, commonly referred to as a 2/4/2 configuration. It is shown as incomplete (without microvias, bumps, etc.) to clearly illustrate the position of the capacitors. The positions of each of the five capacitors are designated Case 1 to 5. In Case 1, the capacitor is placed between the top two build-up layers, closest to the semiconductor device; in Case 2 the capacitor is placed on the top of the core laminate; in Case 3 the capacitor is placed 100 um inside the core BT laminate; in Case 4 the capacitor is placed in the middle of the core laminate; and in Case 5 the capacitor is placed at the bottom of the structure on the bottom build-up layer. In all cases, the diameter of the microvias was 100 μm and the spacing between them was 300 μm.

Using these inductance values and lengths, simulations were performed to show the relationship between the impedance reduction and capacitor distance from the die. The simulations were based on four, 2 mm square capacitors placed directly beneath the die for the five cases. The capacitor properties used for the simulations were: capacitance equal to 5.31 pF (picoFarad), Equivalent Series Resistance equal to 8.59 milliOhms and Equivalent Series Inductance of the capacitor equal to 27.11 pH (picoHenries).

Figure 8:
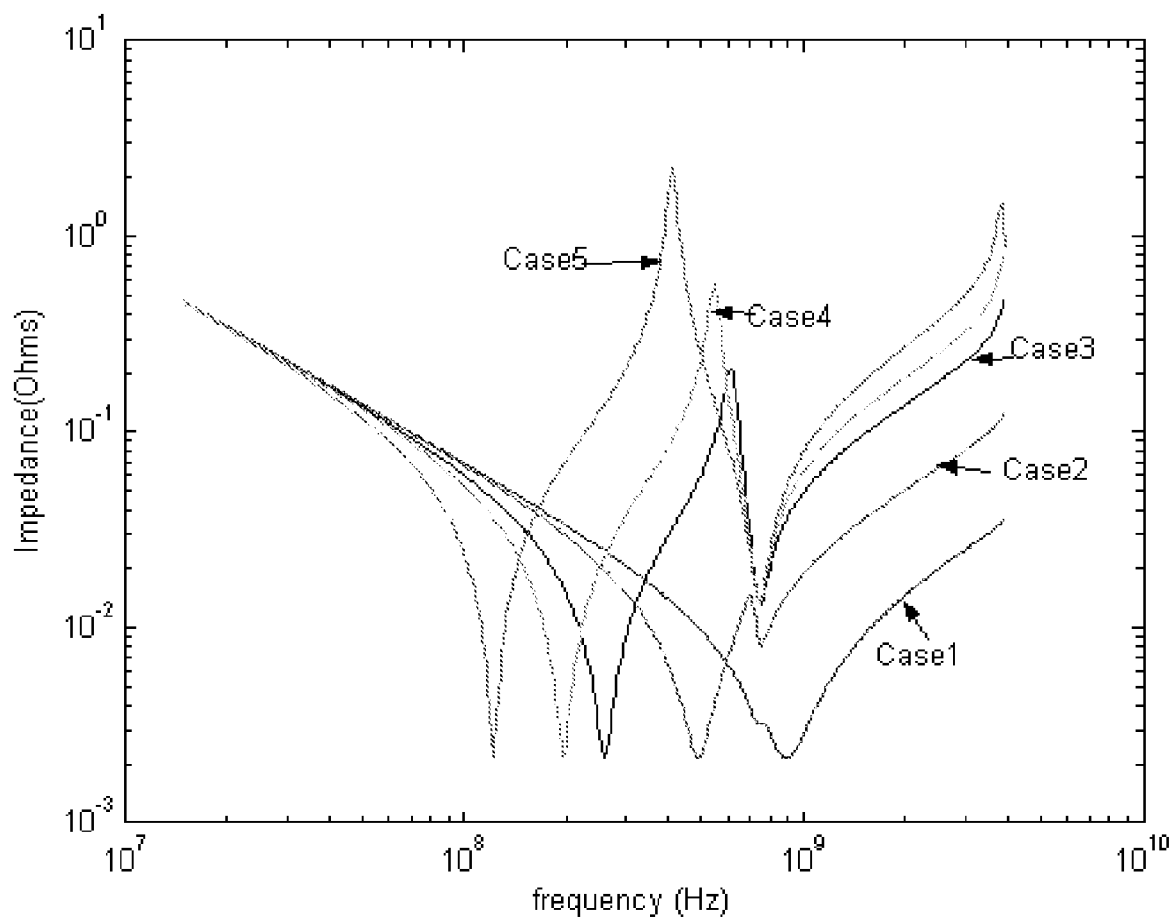
FIG. 8 shows the electrical simulation results for impedance versus frequency response for the five capacitor locations shown in FIG. 7.

FIG. 8 plots the impedance versus frequency data for these simulations and shows the resonant frequencies of the capacitors resulting from capacitor placement. As can be seen, the resonant frequency of case 1 is close to a frequency of $10^9$ Hertz (1 GHz). The resonant frequencies for the other cases are substantially below this frequency.

Figure 9:
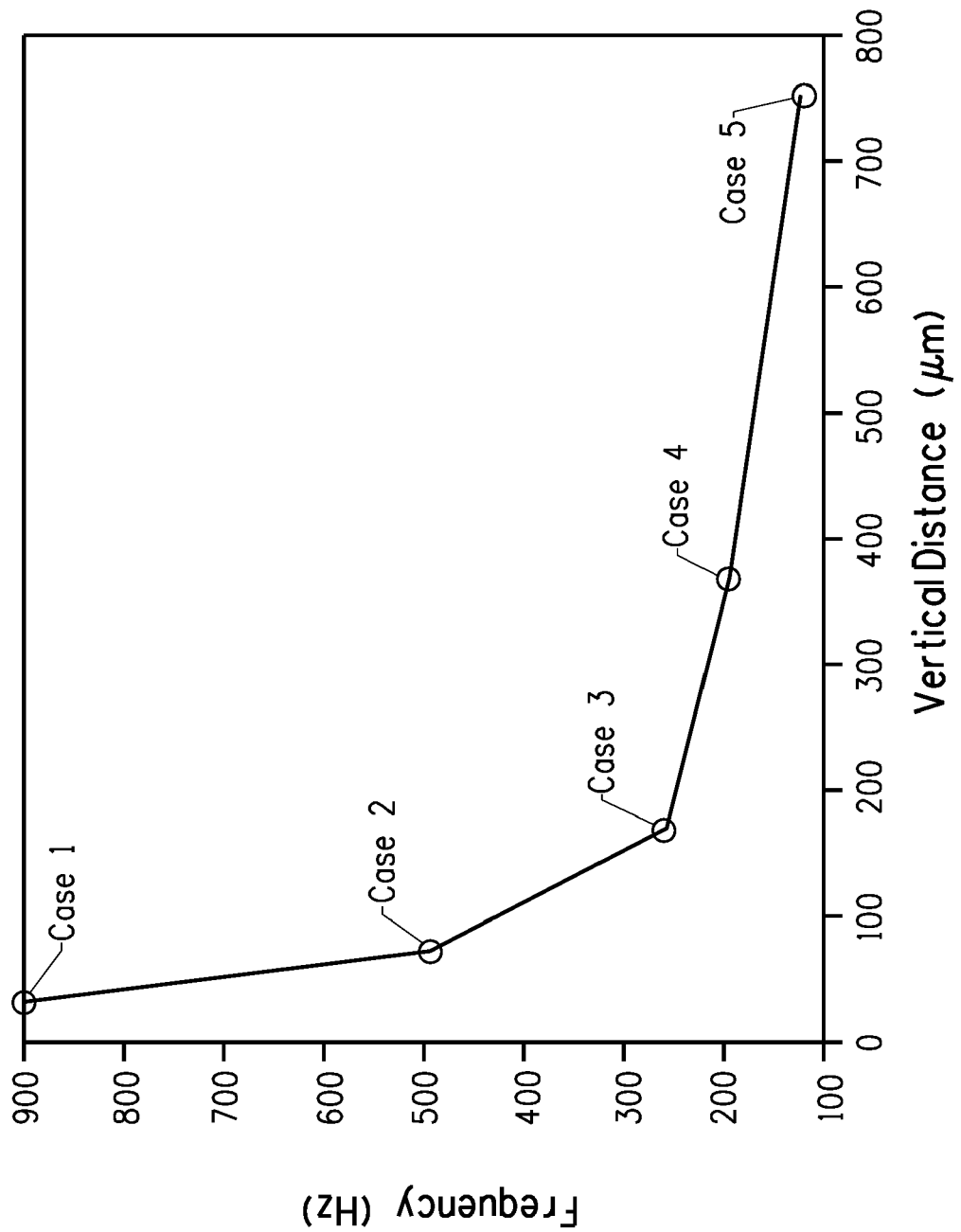
FIG. 9 plots resonant frequency versus distance from the semiconductor device for the five capacitor locations shown in FIG. 7.

FIG. 9 is a plot of the resonant frequency in MHz for each case versus the distance from the IC illustrating the increase of resonant frequency resulting from close placement of the capacitor to the IC. The higher the resonant frequency the more effective the capacitor(s) are in supplying charge to the IC.

It is well known that increased inductance slows the voltage response from the capacitor to the semiconductor IC device. Shortening the distance between the capacitor and the semiconductor is shown to lower the inductance thereby, allowing for a more rapid voltage response from the capacitors.

Shortening the distance of the capacitor to the semiconductor also raises the resonant frequencies of the capacitors thereby, providing for lower impedance at the higher frequencies. This results in lower noise at the higher operating frequencies.

The above example shows the value of the methods described herein for placing high capacitance thin-film capacitors within the build-up layers of the printed wiring board close to the semiconductor device.

What is claimed is:

1. A method of making a device comprising a printed wiring board, the method comprising:
providing at least one foil structure having
two sides and comprising
a known good, thin-film, fired-on-foil capacitor comprising a dielectric layer and a second electrode layer having a footprint;
applying metal to a side of the foil structure containing the second electrode;
patterning a side of the foil structure not containing the second electrode to form a plurality of first electrodes;
laminating the patterned side of the foil structure to a build-up layer of a printed wiring board (PWB);
patterning the side of the foil structure containing the second electrode of the fired-on-foil capacitor to form a plurality of second electrodes within the footprint of the second electrode layer,
wherein the forming of the plurality of the first electrodes and of the plurality of the second electrodes forms a plurality of singulated capacitors of a certain size and pitch such that each electrodes is available to be directly attached to a terminal of an integrated circuit; and
wherein the plurality of singulated capacitors lies directly under and within an area of the integrated circuit.

2. The method of claim 1, wherein each electrode of the singulated capacitors that is attached to a terminal of the integrated circuit is so attached by forming and plating a via that connects the electrode to the terminal of the integrated circuit.

3. The method of claim 1, wherein the entire area of the dielectric layer is supported on the foil structure.

4. The method of claim 1, wherein the patterned side of the foil structure not containing the fired-on-foil capacitor is laminated to other PWB layers, thereby creating a coreless multilayer structure either in a single lamination step wherein multiple layers are laminated together in unison, or in multiple lamination steps wherein each layer is laminated individually.

5. The method of claim 1, further comprising:
testing the fired-on-foil capacitor to determine that the capacitor has the quality of characteristic of the capacitor.

6. The method of claim 5, further comprising:
sorting the diced component derived from the known good, fired-on-foil property of the capacitor incorporating the diced component into the build-up layer according to its property of the capacitor.

7. The method of claim 1, further comprising:
before patterning, applying a carrier film to the side of the foil structure containing a capacitor.

8. A method of making a device comprising a printed wiring board, the method comprising:
providing at least one foil structure having
two sides and comprising
a known good, thin-film, fired-on-foil capacitor comprising
a dielectric layer and
a second electrode layer having a footprint;
applying metal to a side of the foil structure containing the second electrode;
patterning a side of the foil structure not containing the second electrode to form a plurality of first electrodes;
dicing the foil structure to form known good, diced components, the known good, diced components comprising at least one fired-on-foil capacitor;
picking and placing onto a build-up layer of the printed wiring board (PWB) at least one diced component so that the patterned side of the foil structure contacts the build-up layer;

laminating at least one known good, diced component to the build-up layer;

patterning the side of the foil structure containing the second electrode of the fired-on foil capacitor to form a plurality of second electrodes within the footprint of the second electrode layer, wherein the forming of the plurality of the first electrodes and of the plurality of the second electrodes forms a plurality of singulated capacitors of a certain size and pitch such that each electrodes is available to be directly attached to a terminal of an integrated circuit; and wherein the plurality of singulated capacitors lies directly under and within an area of the integrated circuit.

9. The method of claim 8, wherein each electrode of the singulated capacitors that is attached to a terminal of the integrated circuit is so attached by forming and plating a via that connects the electrode to the terminal of the integrated circuit.

10. The method of claim 8, wherein the entire area of the dielectric layer is supported on the foul structure.

11. The method of claim 8, wherein the patterned side of the foil structure not containing the fired-on-foil capacitor is laminated to other PWB layers, thereby creating a coreless multilayer structure either in a single lamination step wherein multiple layers are laminated together in unison, or in multiple lamination steps wherein each layer is laminated individually.

12. The method of claim 11, further comprising:

preventing assembly of components to the printed wiring board containing the known bad, fired-on-foil capacitor.

13. The method of claim 8, further comprising:

testing the fired-on-foil capacitor to determine that the capacitor has the quality of characteristic of the capacitor.

14. The method of claim 8, further comprising:

before patterning, applying a carrier film to the side of the foil structure containing a capacitor.

* * * * *

UNITED STATES PATENT AND TRADEMARK OFFICE
CERTIFICATE OF CORRECTION

PATENT NO.      : 7,841,075 B2
APPLICATION NO. : 11/765113
DATED           : November 30, 2010
INVENTOR(S)     : William Borland et al.

It is certified that error appears in the above-identified patent and that said Letters Patent is hereby corrected as shown below:

Col. 16, line 19: "each electrodes" should read --each electrode--

Col. 16, line 43: after "fired-on-foil" insert --capacitor by capacitance tolerance or other electrical--

Col. 16, line 43: after "property of capacitor" insert --; and--

Col. 16, line 44: after "according to" delete --its--

Col. 16, line 45: before "property" insert --capacitance tolerance or other electrical--

Col. 17, line 10: "each electrodes" should read --each electrode--

Col. 17, line 20: "foul" should read --foil--

Col. 18, line 9: before "preventing" insert --identifying known bad, fired-on-foil capacitor; and--

Col. 18, line 13: after "quality of" insert --known good by capacitance and/or other electrical--

Signed and Sealed this
Twelfth Day of April, 2011

David J. Kappos
*Director of the United States Patent and Trademark Office*